United States Patent
Wang et al.

(10) Patent No.: US 11,329,047 B2
(45) Date of Patent: May 10, 2022

(54) THIN-FILM TRANSISTOR EMBEDDED DYNAMIC RANDOM-ACCESS MEMORY WITH SHALLOW BITLINE

(71) Applicant: Intel Corporation, Santa Clara, CA (US)

(72) Inventors: Yih Wang, Portland, OR (US); Abhishek A. Sharma, Hillsboro, OR (US); Tahir Ghani, Portland, OR (US); Allen B. Gardiner, Portland, OR (US); Travis W. Lajoie, Forest Grove, OR (US); Pei-hua Wang, Beaverton, OR (US); Chieh-jen Ku, Hillsboro, OR (US); Bernhard Sell, Portland, OR (US); Juan G. Alzate-Vinasco, Tigard, OR (US); Blake C. Lin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 799 days.

(21) Appl. No.: 15/956,379

(22) Filed: Apr. 18, 2018

(65) Prior Publication Data
US 2019/0326296 A1 Oct. 24, 2019

(51) Int. Cl.
*H01L 27/108* (2006.01)
*H01L 27/12* (2006.01)
(Continued)

(52) U.S. Cl.
CPC ...... *H01L 27/10814* (2013.01); *H01L 23/528* (2013.01); *H01L 23/5223* (2013.01);
(Continued)

(58) Field of Classification Search
CPC ............. H01L 29/7869; H01L 27/1225; H01L 27/10814
See application file for complete search history.

(56) References Cited

U.S. PATENT DOCUMENTS 5,907,166 A * 5/1999 Casper .................. H01L 23/528
257/202
6,143,601 A 11/2000 Sun
(Continued)

FOREIGN PATENT DOCUMENTS

WO 2018111310 A1 6/2018
WO 2018186835 A1 10/2018

OTHER PUBLICATIONS

European Extended Search Report issued in EP Application No. 19161451.0 dated Jan. 7, 2020; 13 pages.
(Continued)

*Primary Examiner* — John A Bodnar
(74) *Attorney, Agent, or Firm* — Patent Capital Group

(57) ABSTRACT

Described herein are embedded dynamic random-access memory (eDRAM) memory cells and arrays, as well as corresponding methods and devices. An exemplary eDRAM memory array implements a memory cell that uses a thin-film transistor (TFT) as a selector transistor. One source/drain (S/D) electrode of the TFT is coupled to a capacitor for storing a memory state of the cell, while the other S/D electrode is coupled to a bitline. The bitline may be a shallow bitline in that a thickness of the bitline may be smaller than a thickness of one or more metal interconnects provided in the same metal layer as the bitline but used for providing electrical connectivity for components outside of the memory array. Such a bitline may be formed in a separate process than said one or more metal interconnects. In an embodiment, the memory cells may be formed in a back end of line process.

25 Claims, 15 Drawing Sheets

(51) Int. Cl.
  *H01L 23/528* (2006.01)
  *H01L 23/522* (2006.01)
  *H01L 27/06* (2006.01)

(52) U.S. Cl.
  CPC ...... *H01L 23/5226* (2013.01); *H01L 27/0605* (2013.01); *H01L 27/10855* (2013.01); *H01L 27/10873* (2013.01); *H01L 27/10885* (2013.01); *H01L 27/10891* (2013.01); *H01L 27/10897* (2013.01); *H01L 27/124* (2013.01); *H01L 27/1225* (2013.01); *H01L 27/1255* (2013.01); *H01L 27/1262* (2013.01)

(56) References Cited

U.S. PATENT DOCUMENTS

| | | |
|---|---|---|
| 9,672,917 B1 | 6/2017 | Costa et al. |
| 2001/0006245 A1* | 7/2001 | Yunogami ............... H01L 28/65 257/513 |
| 2002/0190294 A1 | 12/2002 | Iizuka et al. |
| 2007/0235792 A1 | 10/2007 | Kwon et al. |
| 2008/0079050 A1 | 4/2008 | Tzeng et al. |
| 2010/0157647 A1 | 6/2010 | Rinerson et al. |
| 2011/0089531 A1* | 4/2011 | Hillman ................ H01L 24/82 257/532 |
| 2012/0012897 A1 | 1/2012 | Besser et al. |
| 2012/0068335 A1 | 3/2012 | Song |
| 2012/0286260 A1 | 11/2012 | Noda et al. |
| 2013/0070506 A1 | 3/2013 | Kajigaya |
| 2014/0124728 A1 | 5/2014 | Kim et al. |
| 2017/0213833 A1* | 7/2017 | Godo ................. H01L 29/7869 |
| 2017/0271341 A1 | 9/2017 | Tanaka et al. |
| 2017/0271381 A1 | 9/2017 | Sone et al. |
| 2018/0082733 A1 | 3/2018 | Tanaka et al. |
| 2018/0226414 A1 | 8/2018 | Zhang |
| 2020/0035683 A1 | 1/2020 | Sharma et al. |

OTHER PUBLICATIONS

International Search Report and Written Opinion for PCT Application No. PCT/US2017/025880 dated Dec. 28, 2017, 11 pages.
European Office Action in European Patent Application No. 19180720.5 dated Dec. 23, 2021, 5 pages.

* cited by examiner

THIN-FILM TRANSISTOR EMBEDDED DYNAMIC RANDOM-ACCESS MEMORY WITH SHALLOW BITLINE

BACKGROUND

Embedded memory is important to the performance of modern system on a chip (SoC) technology. Static random-access memory (SRAM) is one example of embedded memory, particularly suitable for modern SoC due to its compatibility with fabrication processes used to manufacture computing logic, e.g. front end of line (FEOL) processes. However, for some applications demanding large on-die cache, such as tens of megabytes (MBs) for handling memory bandwidth, the area and standby power of a SRAM-based cache may pose significant challenges to SoC design. Alternative higher-density embedded memory technology, such as dynamic random-access memory (DRAM) and in particular, embedded DRAM (eDRAM), has been introduced to address the limitation in density and standby power of a large SRAM-based cache.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
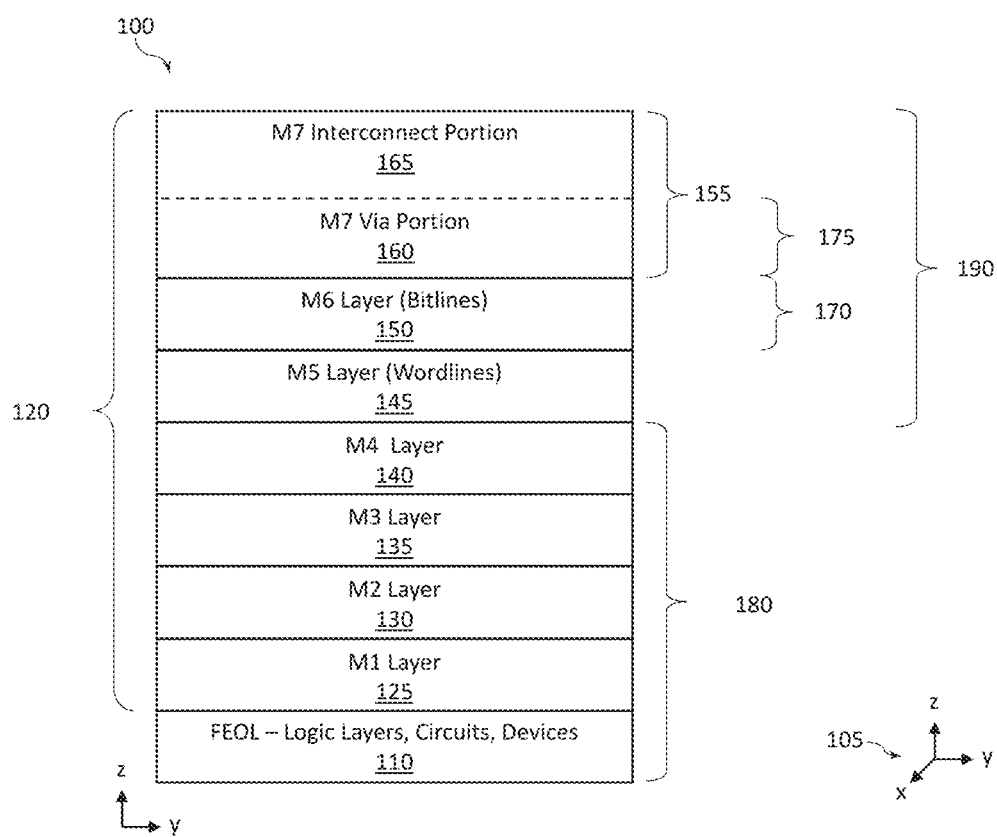
FIG. 1 provides a schematic illustration of a cross-sectional view of an exemplary integrated circuit (IC) device, according to some embodiments of the present disclosure

In general, described herein are eDRAM memory cells and arrays, as well as corresponding methods and devices. An exemplary eDRAM memory array implements a memory cell that uses a TFT as a selector transistor. One source/drain (S/D) electrode of the TFT is coupled to a capacitor for storing a memory state of the cell, while the other S/D electrode is coupled to a bitline. The bitline may be a shallow bitline in that a thickness of the bitline may be smaller than a thickness of one or more metal interconnects provided in the same metal layer as the bitline but used for providing electrical connectivity for components outside of the memory array. Such a bitline may be formed in a separate process than said one or more metal interconnects. In an embodiment, the memory cells may be formed in a back end of line process.

Some memory devices may be considered "standalone" devices in that they are included in a chip that does not also include computing logic (e.g., transistors for performing processing operations). Other memory devices may be included in a chip along with computing logic and may be referred to as "embedded" memory devices. Using embedded memory to support computing logic may improve performance by bringing the memory and the computing logic closer together and eliminating interfaces that increase latency. Various embodiments of the present disclosure relate to embedded DRAM memory cells and corresponding methods and devices.

A standard eDRAM memory cell includes a capacitor for storing a bit (logical 1 or 0) and a selector transistor. Due to the leakage from the selector transistor, the capacitor is continuously refreshed to restore the voltage to an operational level. In some eDRAM approaches, the selector transistor is implemented as a logic transistor, e.g. a FEOL, logic-process-based, selector transistor, creating multiple challenges.

One challenge relates to the leakage of a selector transistor, i.e. current flowing between the source and drain in an "off" state of a transistor. Since reducing leakage of logic transistors in the scaled technology is difficult, implementing eDRAM in advanced technology nodes (e.g., 10 nanometer (nm), 7 nm, 5 nm, and beyond) can be challenging. In particular, given a certain selector transistor leakage, capacitance of the capacitor of an eDRAM memory cell should be large enough so that sufficient charge can be stored on the capacitor to meet the corresponding refresh times. However, continuous desire to decrease size of electronic components dictates that the macro area of memory arrays continues to decrease, placing limitations on how large the top area (i.e. the footprint) of a given capacitor is allowed to be, which means that capacitors need to be taller in order to have both sufficiently small footprint area and sufficiently large capacitance. As the capacitor dimensions continue to scale, this in turn creates a challenge for etching the openings for forming the capacitors as tall capacitors with small footprint areas require higher aspect ratio openings, something which is not easy to achieve.

Another challenge associated with the use of logic transistors in eDRAM cell approaches relates to the location of the capacitors such eDRAM cells. Namely, it is desirable to provide capacitors in metal layers close to their corresponding selector transistors. Since logic transistors are typically implemented as FEOL transistors provided directly on the substrate, the corresponding capacitors of eDRAM cells then have to be embedded in lower metal layers in order to be close enough to the logic selector transistors. As the pitches of lower metal layers aggressively scale in advanced technology nodes, embedding the capacitors in the lower metal layers poses significant challenges to the scaling of eDRAM.

Embodiments of the present disclosure may improve on at least some of the challenges and issues described above. In contrast to the eDRAM approaches described above, various embodiments of the present disclosure provide eDRAM memory cells and devices that use a TFT for a selector transistor. A TFT is a special kind of a field-effect transistor made by depositing a thin film of an active semiconductor material, as well as a dielectric layer and metallic contacts, over a supporting, typically non-conducting layer. At least a portion of the active semiconductor material forms a channel of the TFT. This is different from conventional, non-thin-film transistors FEOL logic transistors where the active semiconductor channel material is typically a part of a substrate, e.g. a part of a silicon wafer. A TFT may have substantially lower leakage than a logic transistor, allowing to relax the demands on the large capacitance placed on a capacitor of an eDRAM cell. In other words, using a lower-leakage TFT in an eDRAM memory cell allows the eDRAM cell to use a capacitor with lower capacitance and smaller aspect ratio while still meeting the same data retention requirements of other approaches, alleviating the scaling challenges of capacitors. In addition, selector TFTs may be moved to the back end of line (BEOL) layers of an advanced complementary metal-oxide-semiconductor (CMOS) process, which means that their corresponding capacitors can be implemented in the upper metal layers with correspondingly thicker inter-layer dielectric (ILD) and larger metal pitch to achieve higher capacitance. This eases the integration challenge introduced by embedding the capacitors. Furthermore, by embedding the selector transistors and the corresponding capacitors all in the upper metal layers according to at least some embodiments of the present disclosure, the peripheral circuits that control the memory operation can be hidden below the memory area to substantially reduce the memory macro array (i.e. the footprint area in the x-y plane of an exemplary coordinate system shown in the FIGS. of the present disclosure). Peripheral circuits of other eDRAM designs account for more than 35% of the total memory macro area, so moving the peripheral circuits below the memory array can substantially reduce the memory footprint area. Other technical effects will be evident from various embodiments described here.

Thus, and in accordance with some embodiments of the present disclosure, a low-leakage TFT based eDRAM (TFT-eDRAM) is provided. In various embodiments, low-leakage TFT-eDRAM cells described herein may have one or more characteristics such as the selector TFT being embedded in the BEOL layers of a CMOS process, the selector TFT having the gate below the thin film of the active semiconductor layer and having source and drain (S/D) contacts above the thin film layers, the MIM capacitor of the eDRAM cell being embedded in the BEOL layers above the selector TFT and connected to one of the S/D terminals of the selector TFT (e.g. to a source terminal or to a drain terminal), and the bitline of the TFT-eDRAM being connected to the other one of the S/D terminals of the selector TFT. Various TFT-eDRAM cells described herein may be used, for example, to address the scaling challenge of logic transistor (e.g., FEOL) based eDRAM technology and enable high density embedded memory in an advanced CMOS process. In one or more embodiments of the present disclosure, the eDRAM memory cell may use a low-leakage selector TFT as the row selection transistor (row selector or selector transistor) and a metal-insulator-metal (MIM) capacitor to store the data (one bit). By embedding the selector transistor as a TFT embedded in a higher metal layer and with a bottom gate design, the selector transistor may be less susceptible to leakage than if it was formed in the FEOL portion of the integrated circuit. Since the eDRAM memory cell can be fabricated with as little as a single selector transistor, eDRAM can provide higher density and lower standby power versus SRAM in the same process technology.

In some embodiments of the present disclosure, the bitline of a TFT-eDRAM may have a special metallization scheme to reduce bitline capacitance and improve the read sensing margin. For example, in one or more embodiments of the present disclosure, a selector TFT, a bitline connected to one S/D terminal of the selector TFT (e.g., drain terminal), a storage node connected to the other S/D terminal of the selector TFT (e.g., source terminal), a MIM capacitor, and a MIM capacitor plate for coupling the top electrodes of multiple MIM capacitors to a common voltage source may be fabricated in the metal 5 (M5) layer through metal 7 (M7) layer using different fabrication operations than the M5 layer through M7 layer fabrications operations of other areas of the chip or integrated circuit (e.g., outside of the eDRAM), in particular different than M5-M7 layer fabrication operations used to FEOL logic transistors or various connections thereto. For instance, since according to some embodiments of the present disclosure the bitlines of the TFT-eDRAM can be fabricated in a separate operation (compared to the interconnect metals used in circuits outside of the TFT-eDRAM array), the dimensions and materials can be customized for lower bitline capacitance (e.g., between the bitline and the storage nodes), which improves read sensing margin of the TFT-eDRAM. The width and height of the bitline metal in the TFT-eDRAM (also the same material used for the storage nodes) can be reduced to lower bitline capacitance (e.g., with the storage nodes) compared to the width and height of metals used in circuits outside of the eDRAM array. Furthermore, with the TFT-eDRAM memory cell being embedded in the BEOL layers, the peripheral (or control) circuits of the memory array can be implemented under the eDRAM array, which may substantially reduce the memory macro area.

Various memory cell and memory array arrangements described herein may be implemented in, or associated with, one or more components associated with an integrated circuit (IC) or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g. FIGS. 6A-6B, such a collection may be referred to herein without the letters, e.g. as "FIG. 6.""

In the drawings, some schematic illustrations of exemplary structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

In the following detailed description, various aspects of the illustrative implementations will be described using terms commonly employed by those skilled in the art to convey the substance of their work to others skilled in the art. For example, the terms "oxide," "carbide," "nitride," etc. may refer to compounds containing, respectively, oxygen, carbon, nitrogen, etc. In yet another example, a "high-k dielectric" may refer to a material having a higher dielectric constant (k) than silicon oxide, while a "low-k dielectric" may refer to a material having a lower k than silicon oxide. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art. As used herein, a "logic state" (or, alternatively, a "state" or a "bit" value) of a eDRAM memory cell may refer to one of a finite number of states that the cell can have, e.g. logic states "1" and "0," each state represented by a different voltage of the capacitor of the cell. In another example, as used herein, a "READ" and "WRITE" memory access or operations refer to, respectively, determining/sensing a logic state of a memory cell and programming/setting a logic state of a memory cell. In other examples, the term "connected" means a direct electrical or magnetic connection between the things that are connected, without any intermediary devices, while the term "coupled" means either a direct electrical or magnetic connection between the things that are connected or an indirect connection through one or more passive or active intermediary devices. The term "circuit" means one or more passive and/or active components that are arranged to cooperate with one another to provide a desired function.

Exemplary Architecture Considerations

FIG. 1 provides a schematic illustration of a cross-sectional view of an exemplary IC device (e.g., a chip) 100, according to some embodiments of the present disclosure. FIG. 1 illustrates an exemplary coordinate system 105 with axes x-y-z so that the various planes illustrated in FIG. 1 and in some subsequent FIGS. may be described with reference to this coordinate system, e.g. the view shown in FIG. 1 is in the y-z plane, as indicated with y and z axes shown at the lower left corner of FIG. 1. The coordinate system 105 is not shown in subsequent FIGS. in order to not clutter the drawings.

The IC device 100 may be referred to as a TFT-eDRAM arrangement 100 because, as explained below, it will include a TFT-eDRAM included in one or more layers shown in FIG. 1.

As shown in FIG. 1, the IC device 100 may include an FEOL 110 that includes most of the various logic layers, circuits, and devices to drive and control a logic IC. As also shown in FIG. 1, the IC device 100 also includes a BEOL 120 including, in the exemplary illustration of one embodiment of the present disclosure, seven metal interconnection layers: metal 1 (M1) layer 125, metal 2 (M2) layer 130, metal 3 (M3) layer 135, metal 4 (M4) layer 140, metal 5 (M5) layer 145, metal 6 (M6) layer 150, and metal 7 (M7) layer 155 that includes M7 interconnect portion 165 and M6 via portion 160. Various metal layers of the BEOL 120 may be used to interconnect the various inputs and outputs of the FEOL 110.

Generally speaking, and specifically illustrated for the M7 layer 155, each of the metal layers of the BEOL 120, e.g. each of the layers M1-M7 shown in FIG. 1, may include a via portion and an interconnect portion typically provided above the via portion (but which may be provided below the via portion in other embodiments). The interconnect portion of a metal layer is configured for transferring signals along metal lines (also sometimes referred to as "trenches") extending in the x-y plane (e.g. in the x or y directions), while the via portion is configured for transferring signals through metal vias extending in the z direction, e.g. to any of the adjacent metal layers above or below. Accordingly, vias connect metal structures (e.g., metal lines or vias) from one metal layer to metal structures of an adjacent metal layer. While referred to as "metal" layers, layers M1-M7 include only certain patterns of conductive metals, e.g. copper (Cu) or aluminum (Al), or metal alloys, or more generally, patterns of an electrically conductive material, formed in an insulating medium such as interlayer dielectric (ILD). The insulating medium may include any suitable ILD materials such as silicon oxide, silicon nitride, aluminum oxide, and/or silicon oxynitride.

As also shown in FIG. 1, the IC device 100 may be further divided into a memory array 190 and a memory peripheral circuit 180. The memory peripheral circuit 180 may be built in the FEOL 110 and lower metal layers of the BEOL 120, e.g. M1-M4 layers, to control (e.g., access (read/write), store, refresh) the memory array 190. The memory array 190 may be a TFT-eDRAM memory array built in higher metal layers of the BEOL 120, e.g. in M5-M7 layers. As such, the memory array 190 may include low-leakage selector TFTs 170 (e.g. in the M6 layers) and capacitors 175 (e.g. in the M7 via portion 160), as well as wordlines (e.g., row selectors, e.g. in the M5 layer 145) and bitlines (e.g., column selectors, e.g. in the M6 layer 150) making up the TFT-eDRAM memory cells.

Compared to other eDRAM designs that locate a memory control circuit in the same layers as a memory array but in a different macro (or x-y) area of the integrated circuit than the memory array (such as at a periphery of the memory array), the IC device 100 advantageously locates the memory peripheral circuit 180 below the memory array 190 (e.g., substantially in the same x-y area), thus saving valuable x-y area in the finished integrated circuit. In further detail, the IC device 100 may embed the TFT-eDRAM memory cells in higher metal layers, e.g. M5, M6, and M7 via portion layers shown in FIG. 1. For example, the M5 layer 145 can contain the wordlines extending in e.g. the x direction to select a row of memory cells (bits) while the M6 layer 150 can contain the bitlines extending in the y direction to sense/read each of the TFT-EDRAM memory cells (bits) in the selected row and/or to write memory data to any of the memory cells in the selected row. In particular, as explained in greater detail below, the selector TFTs 170 can be fabricated (e.g. in the M6 layer 150) above the wordlines (that serve as or connect to the gate electrodes or contacts of the selector TFTs 170) and below the bitlines (that serve as either source or drain (S/D) electrodes or contacts). For example, a given selector TFT 170 may have a transistor gate below the thin-film active layer (that can be formed at the bottom of the M6 layer 150, such as in the via portion) and source and drain contacts above the thin-film layer.

In some embodiments, the metal gate of the selector TFT in different memory cells may be connected to a continuous M5 line below, such as a copper (Cu)-based metal line, which may provide much lower resistance compared to gate lines formed in the lower (e.g., FEOL) portions of the IC device 100. The continuous M5 line may be used as the wordline of the memory array 190, and may be covered by diffusion barriers or diffusion barrier layers including dielectric layers, such as silicon nitride, silicon carbide, or the like, with vias filled with metal-diffusion barrier films like tantalum nitride (TaN), tantalum (Ta), titanium zirconium nitride (e.g., $Ti_xZr_{1-x}N$, such as X=0.53), titanium nitride (e.g., TiN), titanium tungsten (TiW), or the like. A metal gate layer may cover the diffusion barrier film-filled vias, which electrically connect the copper (Cu) wordline to the metal gates of the selector TFTs, the diffusion barrier film preventing or helping to prevent the diffusion or migration of copper (Cu) from the wordline to the rest of the selector TFTs. An active thin-film layer (e.g., indium gallium zinc oxide, or IGZO) and then source and drain contacts above the thin film layer use the M6 layer 150. The space between the source and drain contacts determines the gate length of the selector TFT. A capacitor 175 may be a three dimensional MIM capacitor embedded in the M7 via portion 160 of the M7 layer 155, below the M7 interconnect portion 165).

Figure 2A:
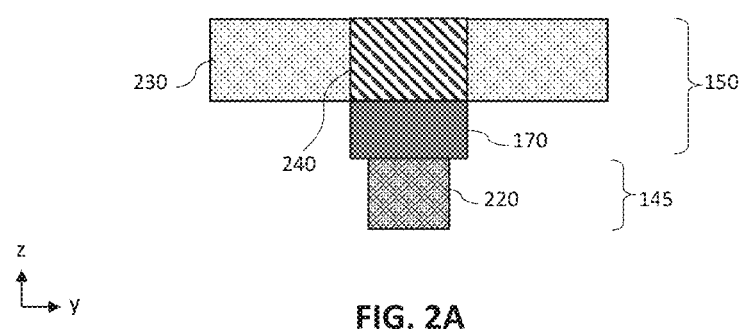
FIGS. 2A-2B are cross-sectional and plan views, respectively, of an example selector thin-film transistor (TFT) in a TFT based embedded DRAM (TFT-eDRAM) memory cell, according to some embodiments of the present disclosure.
Figure 2B:
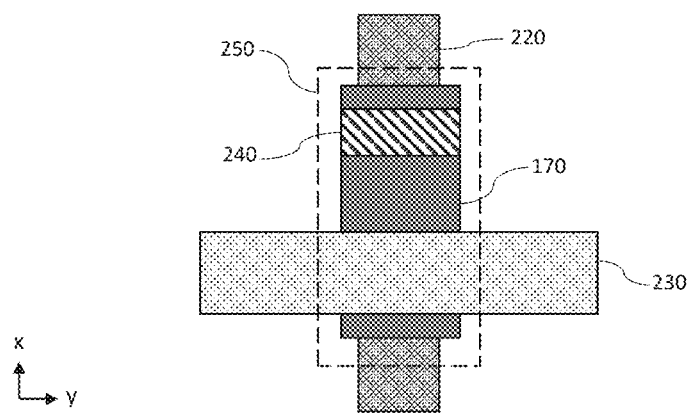
Figure 3A:
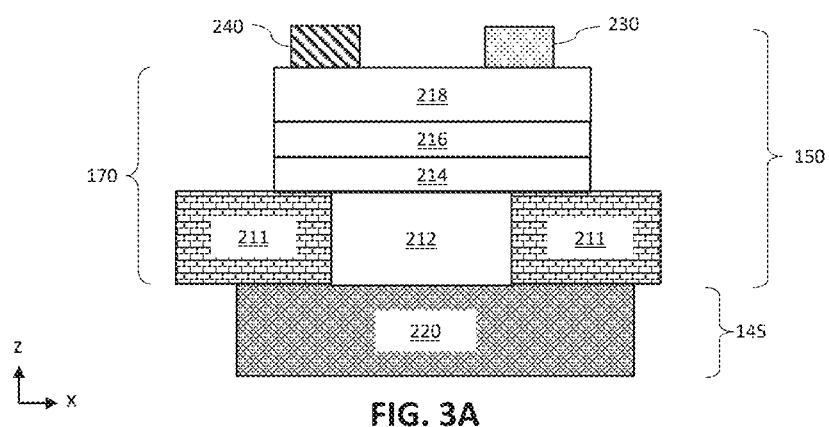
FIGS. 3A-3B are cross-sectional views of an example structure of the selector TFT in the TFT-eDRAM memory cell of FIGS. 2A-2B, according to some embodiments of the present disclosure.
Figure 3B:
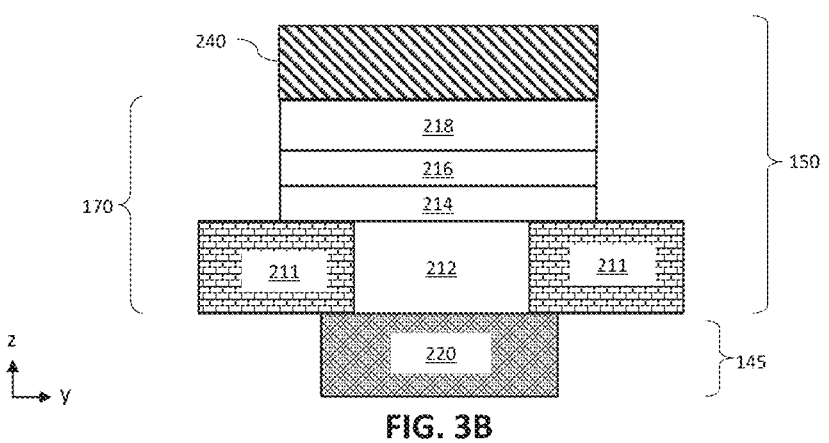

FIGS. 2A-2B are cross-sectional (y-z plane) and plan (y-x plane) views, respectively, of an example selector TFT 170 in a TFT-eDRAM memory cell 250, according to some embodiments of the present disclosure. FIGS. 3A-3B are cross-sectional views (x-z and y-z planes) of an example structure of the selector TFT in the TFT-eDRAM memory cell of FIGS. 2A-2B, according to some embodiments of the present disclosure.

The selector TFT 170 in the memory cell 250 may be coupled to or controlled by wordline 220, which, in some embodiments, may serve as the gate of the selector TFT 170.

A bitline 230 may be coupled to one of the S/D electrodes (which may also be referred to as "contacts" or "terminals") of the selector TFT 170 and a storage node 240 may be coupled to the other one of the S/D electrodes. As is commonly known, source and drain terminals are interchangeable in transistors. Therefore, while some examples and illustrations may be presented here with reference to the bitline 230 coupled to the drain terminal and the storage node 240 coupled to the source terminal of the selector TFT 170, in other embodiments, this may be reversed. For the following explanations, assume that the bitline 230 may serve as the drain contact and the storage node 240 may serve as the source contact of the selector TFT 170. In some embodiments, the wordline 220 may be formed in the M5 layer of the IC device 100 shown in FIG. 1, e.g. substantially with the same process used to fabricate the M5 layer for the rest of the IC device 100, the selector TFT 170 may be formed in the M6 layer 145, e.g. in the via portion of the M6 layer, and the storage node 240 and bitline 230 may also be formed in the M6 layer, e.g. in the interconnect portion of the M6 layer, the M5 layer and above fabrication being customized for the TFT-eDRAM (versus the fabrication of the M5 layer and above done outside of the eDRAM) to account for the specialized structures in the TFT-eDRAM memory array.

For instance, in some embodiments, the M5 layer and above for the TFT-eDRAM memory array may use a different metal, such as titanium nitride (e.g., TiN) or tungsten (W), than the rest of the M6 layer outside of the TFT-eDRAM. In some embodiments, the same metal (e.g., copper) may be used for the M6 layer for both inside the TFT-eDRAM memory array and outside the TFT-eDRAM memory array. Regardless of the choice of metal for the storage node 240 and the bitline 230, in various embodiments, the dimensions of these structures can be further modified from those of the rest of the M6 layer, e.g. to reduce capacitance of the bitline 230 with the storage nodes 240.

Particularly advantageous for reducing capacitance may be to provide the bitline 230 that is relatively shallow (in the z-direction), e.g. to provide the bitline having a thickness (i.e. a dimension measured along the z-axis of the exemplary coordinate system shown in the FIGS.) that is between about 5 and 80 nanometers, including all values and ranges therein, e.g. between about 10 and 50 nanometers, or between about 20 and 35 nanometers. In some embodiments, the bitline 230 may have a thickness that is at least about 30% smaller, e.g. at least about 50% or at least about 70% smaller, than a thickness of the metal layer in which the bitline 230 is implemented (e.g. M6) but outside of the memory array. Such a bitline may be fabricated in a separate process from the M6 metal lines formed for providing electrical connectivity to components outside of the memory array and may be electrically connected to said metal lines using a bridge via, described in greater detail below.

In some embodiments, the bitlines 230 can be connected to sense amplifiers and other bitline drivers below the TFT-eDRAM memory array (e.g., below the M5 layer) by first coupling the bitlines 230 through the M6 layer (e.g., copper interconnect and possibly the bridge via) in an area outside or substantially at the periphery of the TFT-eDRAM memory array, where the bitline signals can be routed through via portions of the M6 layer and further below if needed.

FIGS. 3A-3B illustrate further details of the selector TFT 170. As shown in FIGS. 3A-3B, the selector TFT 170 may be provided substantially above the wordline 220, which may be implemented in the M5 layer 145 of the IC device 100 shown in FIG. 1. In this context, the term "above" refers to being further away from the substrate or the FEOL 110 of the IC device 100, while the term "below" refers to being closer towards the substrate or the FEOL 110. The selector TFT 220 may be a bottom-gated TFT in that its gate stack comprising a gate dielectric 216 and a gate electrode 214 may be provided below its active layer (channel layer) 218, e.g. between the channel layer 218 and the FEOL 110, and the channel layer 218 may be between the gate stack and the bitline 230 forming the drain terminal of the selector TFT 170 and the storage node 240 forming the source terminal of the selector TFT 170 (again, in other embodiments, this exemplary designation of S/D terminals may be reversed). Thus, the wordline 220 may be between the substrate or the FEOL 110 and the gate electrode 214, and the bitline 230 may be further away from the substrate or the FEOL 110 than the channel layer 218.

The channel layer 218 may be composed of semiconductor material systems including, for example, n-type or p-type materials systems. In some embodiments, the channel layer 218 may include a high mobility oxide semiconductor material, such as tin oxide, antimony oxide, indium oxide, indium tin oxide, titanium oxide, zinc oxide, indium zinc oxide, indium gallium zinc oxide, gallium oxide, titanium oxynitride, ruthenium oxide, or tungsten oxide. In general, the channel layer 218 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, indium gallium zinc oxide (IGZO), indium telluride, molybdenite, molybdenum diselenide, tungsten diselenide, tungsten disulfide, n- or p-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In particular, the channel layer 218 may be formed of a thin film material. Some such materials may be deposited at relatively low temperatures, which allows depositing them within the thermal budgets imposed on back-end fabrication to avoid damaging the front-end components such as the FEOL 110. In some embodiments, the channel layer 218 may have a thickness between about 5 and 30 nanometers, including all values and ranges therein.

The S/D electrodes of the selector TFT 170, shown in the FIGS. as provided by the bitline 230 and the source node 240, may include any suitable electrically conductive material, alloy, or a stack of multiple electrically conductive materials. In some embodiments, the S/D electrodes of the selector TFT 170 may include one or more metals or metal alloys, with metals e.g., copper, ruthenium, palladium, platinum, cobalt, nickel, hafnium, zirconium, titanium, tantalum, and aluminum, tantalum nitride, titanium nitride, tungsten, doped silicon, doped germanium, or alloys and mixtures of these. In some embodiments, the S/D electrodes of the selector TFT 170 may include one or more electrically conductive alloys, oxides, or carbides of one or more metals. In some embodiments, the S/D electrodes of the selector TFT 170 may include a doped semiconductor, such as silicon or another semiconductor doped with an n-type dopant or a p-type dopant. Metals may provide higher conductivity, while doped semiconductors may be easier to pattern during fabrication. In some embodiments, the S/D electrodes of the selector TFT 170 may have a thickness (i.e. dimension measured along the z-axis of the exemplary coordinate system shown in the FIGS.) between about 2 nanometers and 1000 nanometers, preferably between about 2 nanometers and 100 nanometers.

A gate dielectric 216 may laterally surround the channel layer 218, and the gate electrode 214 may laterally surround the gate dielectric 216 such that the gate dielectric 216 is disposed between the gate electrode 214 and the channel layer 218. In various embodiments, the gate dielectric 216 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 216 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 216 during manufacture of the selector TFT 170 to improve the quality of the gate dielectric 216. In some embodiments, the gate dielectric 216 may have a thickness between about 0.5 nanometers and 3 nanometers, including all values and ranges therein, e.g., between about 1 and 3 nanometers, or between about 1 and 2 nanometers.

In some embodiments, the gate dielectric 216 may be a multilayer gate dielectric, e.g., it may include any of the high-k dielectric materials in one layer and a layer of IGZO. In some embodiments, the gate stack (i.e., a combination of the gate dielectric 216 and the gate electrode 214) may be arranged so that the IGZO is disposed between the high-k dielectric and the channel layer 218. In such embodiments, the IGZO may be in contact with the channel layer 218, and may provide the interface between the channel layer 218 and the remainder of the multilayer gate dielectric 216. The IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10).

The gate electrode 214 may include at least one p-type work function metal or n-type work function metal, depending on whether the selector TFT 170 is a P-type metal oxide semiconductor (PMOS) transistor or an N-type metal oxide semiconductor (NMOS) transistor. For a PMOS transistor, metals that may be used for the gate electrode 214 may include, but are not limited to, ruthenium, palladium, platinum, cobalt, nickel, and conductive metal oxides (e.g., ruthenium oxide). For an NMOS transistor, metals that may be used for the gate electrode 214 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 214 may consist of a stack of two or more metal layers, where one or more metal layers are work function metal layers and at least one metal layer is a fill metal layer. Further metal layers may be included for other purposes, such as to act as a diffusion barrier layer, described below.

FIGS. 3A-3B further illustrate that the bottom-gated selector TFT 170 may further, optionally, include layers such as a diffusion barrier layer 212, which may be surrounded by a layer of etch resistant material (e.g., an etch stop layer 211). In some embodiments, the diffusion barrier 212 may be a metal- or copper-diffusion barrier (e.g., a conductive material to reduce or prevent the diffusion of metal or copper from wordline 220 into the gate electrode 214 while still maintaining an electrical connection between the wordline 220 and the gate electrode 214) on the wordline 220 such as tantalum nitride (TaN), tantalum (Ta), titanium zirconium nitride (e.g., $Ti_xZr_{1-x}N$, such as X=0.53), titanium nitride (e.g., TiN), titanium tungsten (TiW), combination (such as a stack structure of TaN on Ta), or the like. For instance, the diffusion barrier 212 can include a single- or multi-layer structure including a compound of tantalum (Ta) and nitrogen (n), such as TaN or a layer of TaN on a layer of Ta. In some embodiments, a layer of etch resistant material (e.g., the etch stop 211) such as silicon nitride or silicon carbide may be formed over the wordline 220 with vias for a metal (or copper) diffusion barrier film 212 such as TaN or a TaN/Ta stack. The gate electrode 214 can be a conductive material on the diffusion barrier 212, such as metal, conductive metal oxide or nitride, or the like. For example, in one embodiment, the gate electrode 214 may be titanium nitride (TiN). In another embodiment, the gate electrode 214 may be tungsten (W).

The active layer 218 can be in contact with the bitline 230 (e.g., at a first region of the active layer 218, such as a drain region) and the storage node 240 (e.g., at a second region of the active layer 218, such as a source region, with a semi-conductive channel region between the first region and the second region). In some embodiments, such an active layer 218 channel may include only majority carriers in the thin film. Accordingly, the active layer 218 channel may require a relatively high bias (as e.g. supplied by the wordline 220, diffusion barrier film 212, and gate electrode 214) to activate.

Figure 4:
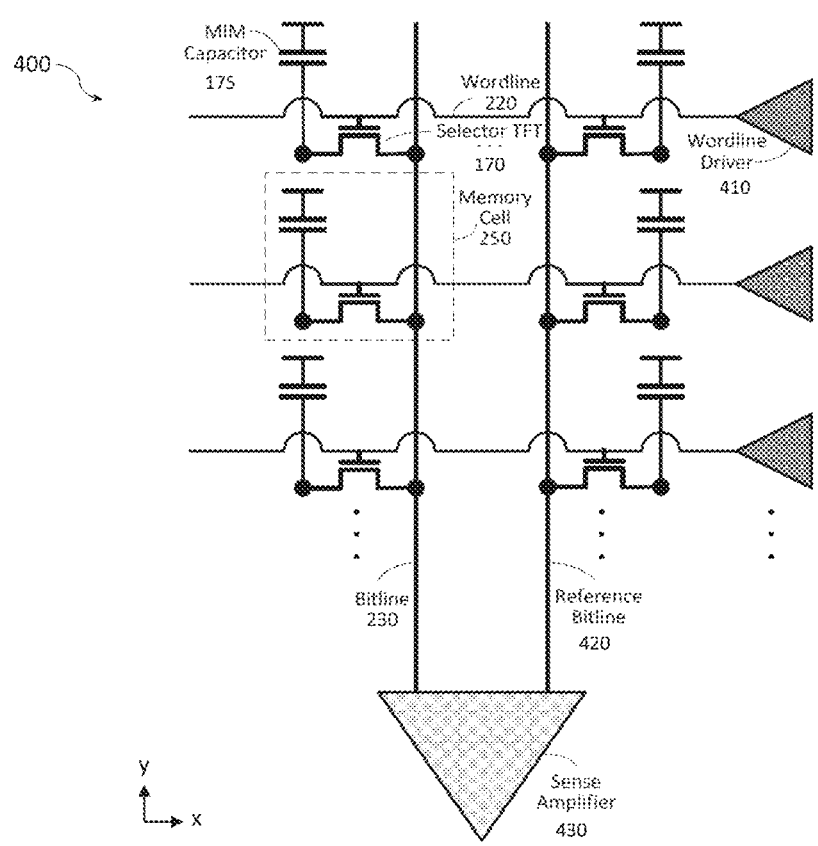
FIG. 4 is a schematic plan of an exemplary configuration of a TFT-eDRAM memory array, according to some embodiments of the present disclosure.

FIG. 4 is a schematic plan (x-y view) of an exemplary configuration 400 of a TFT-eDRAM memory array 190, according to some embodiments of the present disclosure. As shown in FIG. 4, the memory array configuration 400 may include memory cells 250 at crossing regions of wordlines 220 and bitlines 230 (e.g., each memory cell 250 being driven by a unique pair of wordline 220 and bitline 230), each memory cell 250 including a selector TFT 170 and a capacitor 175, e.g. a MIM capacitor 175 (only some elements are shown with reference numerals in order to not clutter the drawing). Each wordline may be selected by a corresponding wordline driver 410, while the corresponding bitlines 230 are precharged to a set or predetermined voltage, and then sense the charge in the MIM capacitor 175 of each of the corresponding bits of the selected wordline 220. In addition, a reference column of memory cells may provide a corresponding reference signal (e.g., halfway between a logic low value and a logic high value) over a reference bitline 420 substantially concurrently with the sensing of the desired bit on the bitline 230. These two values may be compared, e.g. by a sense amplifier 430, which may be configured to determine whether the desired bit or memory cell is a logic high value (e.g., 1) or a logic low value (e.g., 0).

The memory cells 250 of the memory array (e.g. the memory array 190 shown in FIG. 1) may be embedded in the BEOL layers (such as the higher metal interconnect layers of the BEOL 120 shown in FIG. 1), while the peripheral circuits responsible for memory operation (e.g. the peripheral circuit 180 shown in FIG. 1), including the read sense amplifiers 430 (and other bitline driver circuits) and wordline driver circuits 410, may be placed below the memory array (e.g., in the FEOL 110 and lower metal interconnect layers of the BEOL 120) to reduce area of the memory macro array.

Figure 5A:
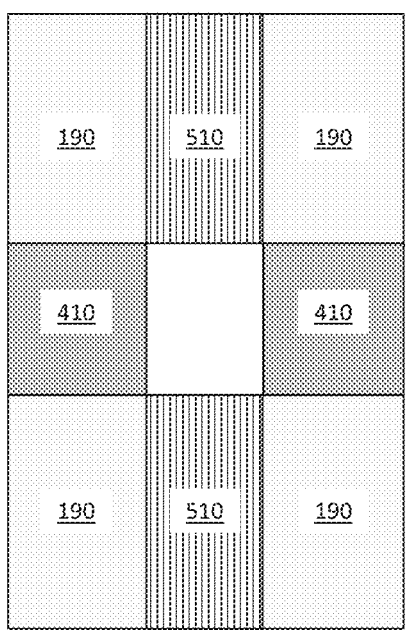
FIGS. 5A-5C are plan (y-x view) views of example layouts of a TFT-eDRAM without and with overlap of the memory array and the memory peripheral circuits, according to some embodiments of the present disclosure.
Figure 5B:
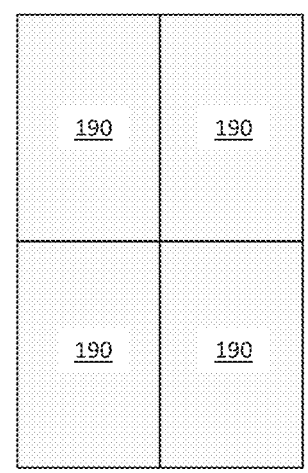
Figure 5C:
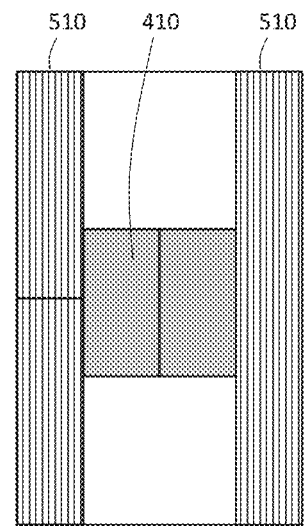

FIG. 5A is a plan (y-x view) view of an example layout of a TFT-eDRAM without overlap of the memory array 190 and the memory peripheral circuit 180 (illustrated as wordline drivers 410 of FIG. 4 and column circuits 510), according to some embodiments of the present disclosure. FIGS. 5B-5C are plan (also y-x views) of an example layout or floorplan of a TFT-eDRAM with overlap of the memory array 190 and at least portions of the memory peripheral circuit 180 with the wordline drivers 410 and column circuits 510, according to some embodiments of the present disclosure.

The column circuits 510 (or bitline drivers) may include devices such as read (bitline) sense amplifiers 430 and pre-charging circuits. FIG. 5A shows the circuits 510 spread out (e.g., occupying FEOL macro area or CMOS logic transistor area) and without overlap. By contrast, FIG. 5B shows the memory array 190 occupying the higher metal interconnection layers of the BEOL 120 (as illustrated in FIG. 1), hence the column circuits 510 and the wordline drivers 410 are not visible in the top view of FIG. 5B; while FIG. 5C shows the memory peripheral circuits 410 and 510 occupying the FEOL 110 and lower metal interconnection layers of the BEOL 120 underneath the memory array 190 (as illustrated in FIG. 1). Since more than 35% of the eDRAM memory macro area can be consumed by the peripheral (memory control) circuits, substantial savings of x-y macro area can be saved by fabricating the memory arrays 190 above the memory peripheral circuits 180, as in one or more embodiments of the present disclosure. In other words, according to some embodiments of the present disclosure, a TFT-eDRAM memory array may be provided with memory cells only using space in the upper metal layers (e.g., M5 layer and above), the peripheral circuits may be moved below the memory cells (e.g., in M4 layer and below, including the FEOL) and substantially reduce memory footprint area.

Figure 6A:
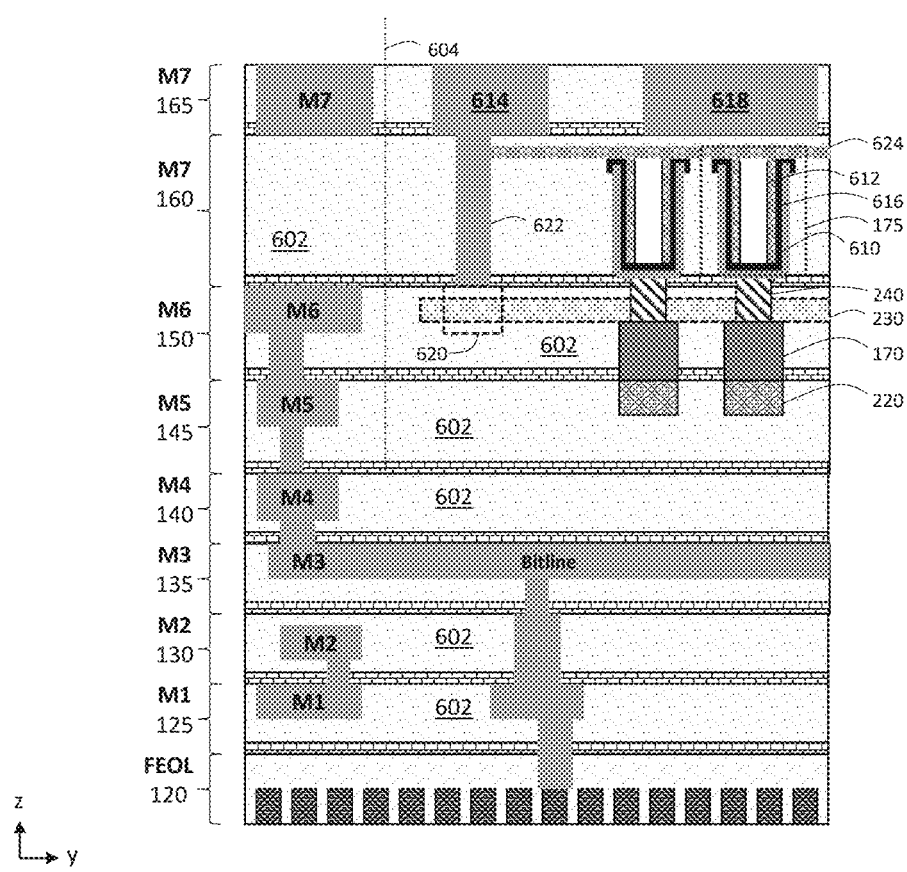
FIGS. 6A-6B are cross-sectional (y-z) views of an exemplary IC device implementing a TFT-eDRAM memory array with shallow bitlines, without and with bridge vias, according to some embodiments of the present disclosure.
Figure 6B:
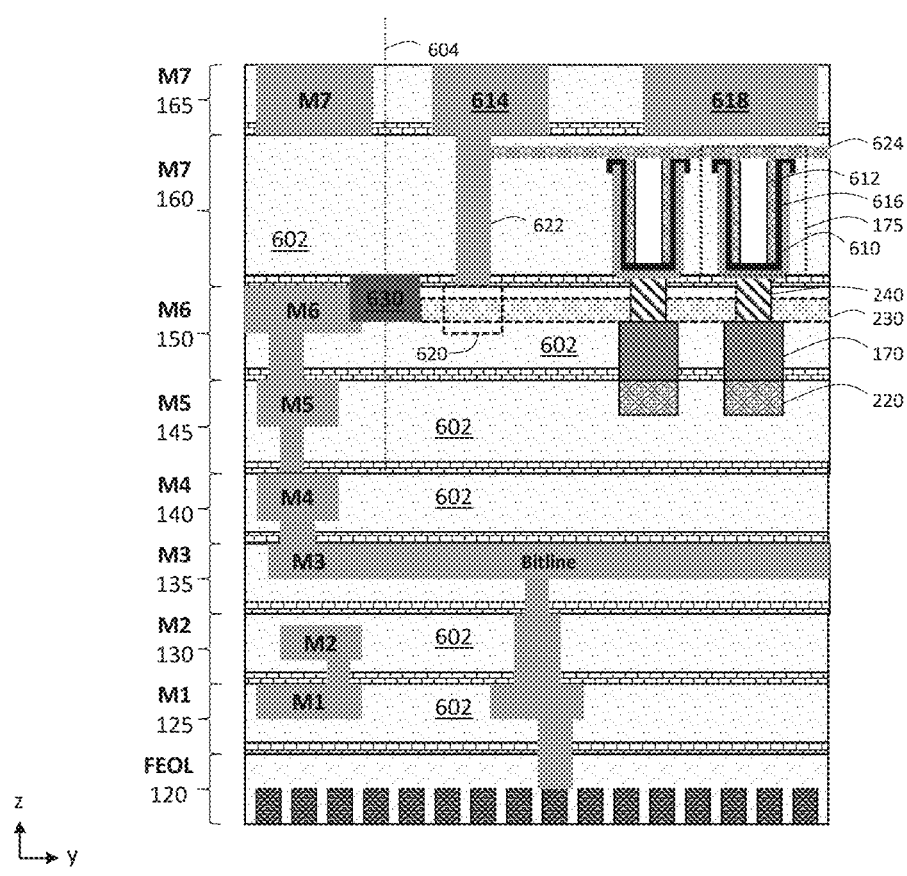

FIGS. 6A and 6B are cross-sectional (y-z) views of an exemplary IC device, e.g. the IC device 100, implementing a TFT-eDRAM memory array, e.g. the memory array 190, with shallow bitlines, e.g. the bitlines 230, without and with a bridge via, according to some embodiments of the present disclosure. In these FIGS., reference numerals from previous FIGS. are intended to illustrate analogous or similar elements and, therefore, in the interests of brevity, their description is not repeated.

FIG. 6A illustrates the FEOL 120 and various BEOL metal layers, e.g. M1 layer 125, M2 layer 130, etc. Reference numeral 602 shown in some of the metal layers illustrates an insulating material in which metal lines and vias for providing electrical connectivity are provided, where the insulating material 602 may be e.g. any of the ILD materials described herein.

A vertical dotted line 604 shown in FIG. 6A may represent an imaginary boundary between components of a TFT-eDRAM memory array 190 being on one side of the line (in the example of FIG. 6A, to the right of the line 604), and components of a regular logic IC being on the other side of the line (in the example of FIG. 6A, to the left of the line 604). To the left of the line 604, exemplary lines and vias for providing electrical connectivity for logic components are shown, some labeled with the metal layer number in which they are included.

To the right of the line 604, an exemplary TFT-eDRAM memory array, e.g. memory array 190, is shown in FIG. 6A, illustrating two exemplary TFT-eDRAM memory cells, e.g. memory cells 250 described above, each of which showing a selector TFT 170 and a capacitor 175, as described above. The individual parts of the selector TFT 170 are not shown in order to not clutter the drawing and since they were described with reference to FIGS. 2A-2B and FIGS. 3A-3B. In accordance with these descriptions, FIG. 6A illustrates that each of the two TFTs 170 shown in this FIG. is a bottom-gated TFT having a respective wordline 220 connected to its' gate electrode (or forming its gate electrode), and having the storage node 240 connected to (or forming) one of its'S/D electrodes and having the bitline 230 connected to (or forming) the other. The bitline 230 is shown as surrounded by a dashed line in order to illustrate that it is in a different plane than the plane of the drawing (e.g. behind and parallel to the plane of the drawing) shown in FIG. 6A.

As shown in FIG. 6A, the capacitor 175 of each of the TFT-eDRAM memory cells may be a MIM capacitor having a first, or bottom, electrode 610 and a second, or top electrode 612, the two electrodes separated by a dielectric material 616 (the dielectric 616 shown in FIG. 6A in black). The top electrode 612 of the at least some of a plurality of TFT-eDRAM memory cells of the memory array may be connected/coupled to a top plate 624 and further to a MIM capacitor plate 614, also illustrated in FIG. 6A.

The storage nodes 240 (e.g. source contacts) of the selector TFTs 170 in different memory cells 250 are separated between the cells 250. Each storage node 240 may be connected to a MIM capacitor 175 above, e.g. to the bottom electrode 610 of the MIM capacitor 175. In some embodiments, as shown in FIG. 6A, the MIM capacitor 175 may be fabricated in the via portion of the M7 layer 160 while the storage nodes 240 and the bitlines 230 may be fabricated in the interconnect portion of the M6 layer 150.

In some embodiments, the MIM capacitor 175 may be fabricated by etching (for example, by photolithography) deep, narrow openings (e.g. trenches) in the via portion of the M7 layer 160, and lining the openings with a thin conductor (such as the bottom electrode 610), a thin insulator (such as the dielectric 616 of the future capacitors), and another thin conductor (such as the top electrode 612), the thin insulator insulating one thin conductor from the other thin conductor, thus forming a capacitor. In some embodiments, the MIM capacitor 175 may be fabricated in a separate process from the rest of the M7 layer fabrication (to account for its large height and different electrode material from the rest of the M7 layer). This creates a relatively large capacitance in the MIM capacitor 175 by having a relatively large surface area for the terminals (e.g., the top and bottom electrodes 612 and 610) separated by a relatively small amount of insulation (e.g., the dielectric 616). The three layers of the capacitor 175 may be lined within the openings by, for example, atomic level deposition (ALD). For instance, the bottom electrode 610 can be lined to a thickness of about 20-40 nanometers using a conductive material (e.g., metal, conductive metal nitride or carbide, or the like), followed by a thin dielectric 616 (to increase capacitance, for example, about 20-40 nanometers), followed by a top electrode 616 again, using metal (such as about 20-40 nm thick), which can be coupled to the top electrode of at least some others, or every other, or all MIM capacitor 175, e.g. in an array of eDRAM memory cells, using the MIM capacitor plate 624. The MIM capacitor 175 can be e.g. about 300 nanometers tall (in the z-direction) in some embodiments, to provide sufficient capacitance.

For example, in one embodiment, the bottom electrode 610 may be tantalum (Ta). In another embodiment, the bottom electrode 610 may be titanium nitride (TiN). In some embodiments, the bottom electrode 610 may be titanium aluminum nitride (e.g., TiAlN, where the molar amount of titanium is at least that of aluminum). In another embodiment, the bottom electrode 610 may be tantalum aluminum carbide (TaAlC). In another embodiment, the bottom electrode 610 may be tantalum nitride (TaN). For example, in one embodiment, the top electrode 612 may be TiN. For example, in one embodiment, the dielectric 616 may be $SiO_2$. In some embodiments, such as to reduce tunneling (e.g., when the dielectric 616 is very thin), the dielectric 616 may be a high-κ material, e.g. any of the high-k materials described above.

Each bottom electrode 610 of the MIM capacitor 175 may connect to a corresponding storage node 240, as shown in FIG. 6A. The bottom electrodes 610 of the different MIM capacitors 175 may be electrically insulated from each other while the top electrodes 612 of at least some of the different MIM capacitors 175, e.g. all capacitors 175, may be electrically connected to each other through the (shared) top plate 624 (connected to the common MIM capacitor plate 614) at the top of the MIM capacitors 175 and also located in the via portion 160 of the M7 layer 155. In some embodiments, there may be separate top plates 624 for separate arrays of MIM capacitors 175. In some embodiments, the top plate 624 may be coupled to a common MIM capacitor plate 614, which may be e.g. in the interconnect portion 165 of the M7 layer, to supply a common voltage to all of the top electrodes 612 through the top plate 624.

In some embodiments, coupling of the top plate 624 to the common MIM capacitor plate 614 may be realized using a capacitor via 622, which, as shown in FIG. 6A, may extend all the way through the M7 layer and land on a landing pad 620 which may be provided in the lower, M6, layer, e.g. at the periphery of the M6 layer. The landing pad 620 is illustrated and described in greater detail with reference to FIG. 8. Because the capacitor via 622 extends all the way through the metal layer landing on a landing pad in a lower layer, such a capacitor via may be referred to as a "through capacitor via." Implementing such through capacitor vias, as opposed to vias which are interconnected somewhere inside a metal layer, may be particularly advantageous in terms of controllable fabrication as the etch of the via may be limited and controlled by the presence of the landing pad.

FIG. 6A further illustrates various interconnects 618 over the memory array, which interconnects may provide signals or supply lines.

The drain contact of the different selector TFTs 170 may be continuous between some of the selector TFTs 170 and may be used as the bitline 230 of the memory array 190. The heights of the source and drain contacts can be optimized to reduce bitline 230 capacitance (e.g., between the source and drain contacts) for better sensing margins. The drain contacts of the selector TFTs also serves as the bitlines 230 of the TFT-eDRAM array. The dimensions of the drain contacts (bitlines 230) can be customized for lower inter-metal capacitance, e.g., by using a separate fabrication operation to form shallow bitlines 230 as described above, versus the fabrication operation for this metal level in areas of the integrated circuit outside of the TFT-eDRAM array (i.e. to the left of the line 604 shown in FIG. 6A). Because such shallow bitlines 230 may be fabricated in a separate fabrication operation, they may not necessarily be directly connected to the metal level in areas of the integrated circuit outside of the TFT-eDRAM array, shown in FIG. 6A as an exemplary metal portion to the left of the line 604, labeled as "M6." The lack of electrical connection between the bitline 230 and M6 portion is shown in FIG. 6A. On the other hand, FIG. 6B illustrates the IC device 100 as shown in FIG. 6A but after bridge vias 630 are provided to electrically connect the bitlines 230 to respective, or a single, metal portion M6.

Figure 7A:
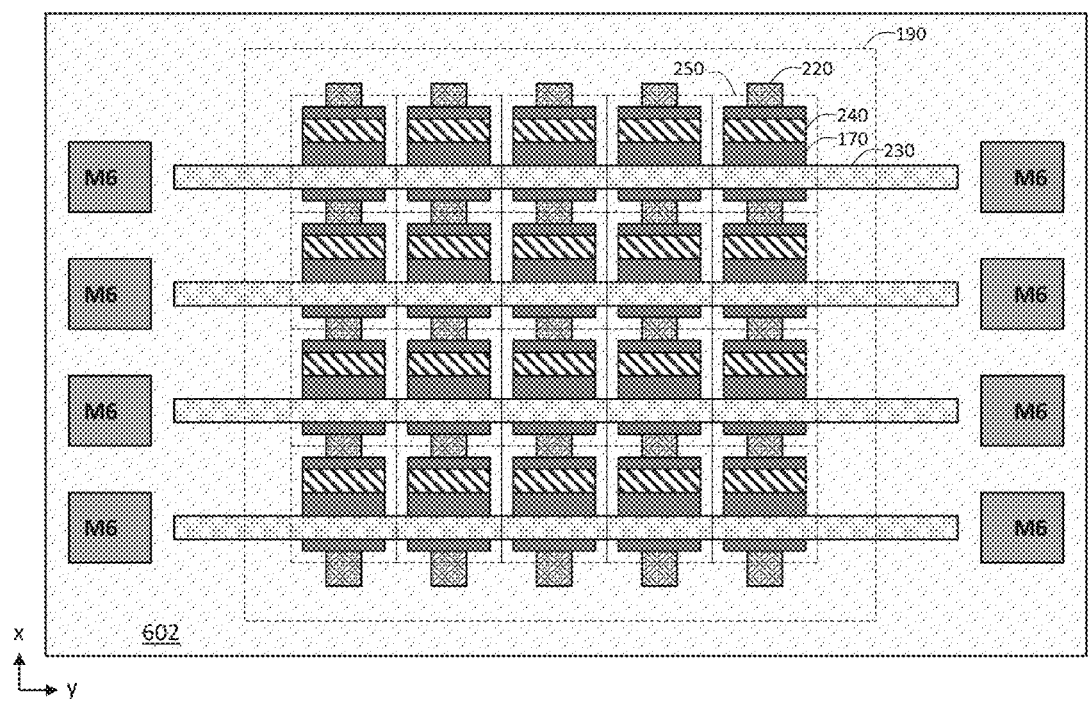
FIGS. 7A-7B are plan (y-x view) views of an exemplary layout of an IC device implementing a TFT-eDRAM memory array, without and with bridge vias, according to some embodiments of the present disclosure.
Figure 7B:
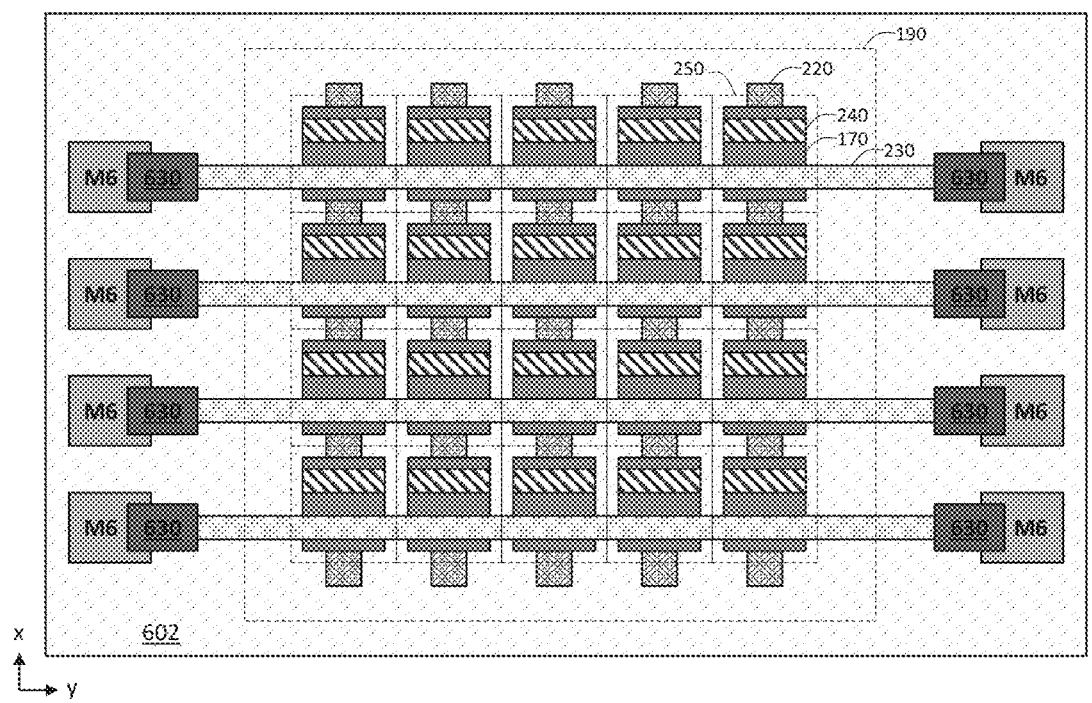

FIGS. 7A-7B are plan vies of an exemplary layout of an IC device, e.g. the IC device 100, implementing a TFT-eDRAM memory array 190, without and with bridge via 630, according to some embodiments of the present disclosure. Similar to FIGS. 6A-6B, in these FIGS., reference numerals from previous FIGS. are intended to illustrate analogous or similar elements and, therefore, in the interests of brevity, their description is not repeated. Similar to FIG. 6A, FIG. 7A provides an illustration before the bridge vias 630 are provided, while FIG. 7B—after. As illustrated in FIG. 7B, the bridge vias 630 may be provided at the periphery of the memory array, e.g. at the outside contour enclosing the memory array 190. Descriptions of various elements shown in FIGS. 7A-7B which are shown and labeled with the same patterns/colors and same reference numerals as in FIGS. 6A-6B are not repeated as the descriptions provided above are applicable to these elements of FIGS. 7A-7B.

Figure 8:
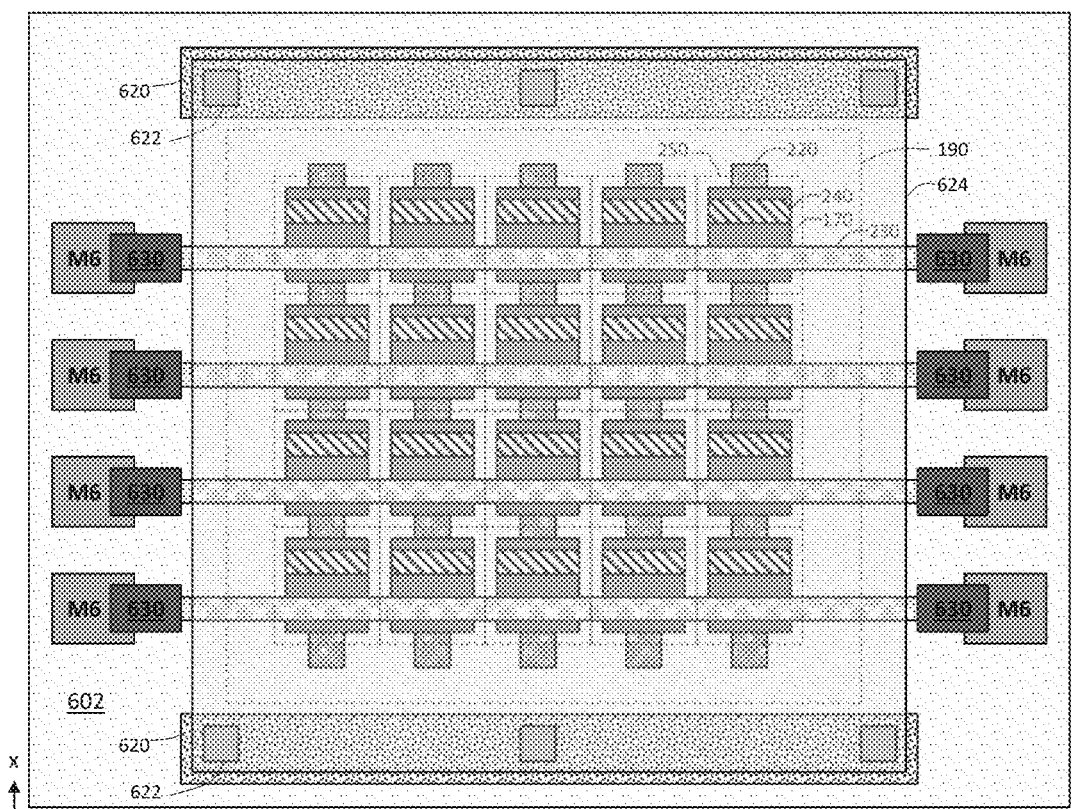
FIG. 8 provides a plan (y-x view) view of an exemplary layout of an IC device implementing a TFT-eDRAM memory array with one or more landing pads and one or more through capacitor vias, according to some embodiments of the present disclosure.

FIG. 8 provides a plan (y-x view) view of an exemplary layout of an IC device, e.g. the IC device 100, implementing a TFT-eDRAM memory array 190, implementing a TFT-eDRAM memory array with one or more landing pads 620 and one or more through capacitor vias 622, according to some embodiments of the present disclosure. The view of FIG. 8 is similar to that of FIG. 7B, except that it further illustrates an example where two landing pads 620 are provided, with three through capacitor vias 622 landing on each of the landing pads 620, the through capacitor vias 622 providing electrical connectivity from the MIM capacitor plate 614 (not specifically shown in FIG. 8 because it's in a further plane above the plane of the drawing) to the common capacitor voltage plate 624 (which is also in a plane above the plane of the drawing of FIG. 8 but is shown as a transparent plate 624). Descriptions of various elements shown in FIG. 8 which are shown and labeled with the same patterns/colors and same reference numerals as in FIGS. 7A-7B are not repeated as the descriptions provided above are applicable to these elements of FIG. 8.

In various embodiments, the landing pad 620 may be made of any suitable electrically conductive material for providing a location for where the through capacitor vias 622 end. For example, in some embodiments, the landing pad 620 may be made of substantially the same material as that used in M6, which may be particularly advantageous if the landing pad 620 and M6 outside of memory array are formed in the same fabrication process.

VARIATIONS AND IMPLEMENTATIONS

Various device assemblies illustrated in FIGS. 1-8 do not represent an exhaustive set of assemblies in which TFT-eDRAM memory cells with shallow bitlines and through capacitor vias as described herein may be implemented, but merely provide examples of such structures/assemblies. In particular, the number and positions of various elements shown in FIGS. 1-8 is purely illustrative and, in various other embodiments, other numbers of these elements, provided in other locations relative to one another may be used in accordance with the general architecture considerations described herein. For example, while FIG. 1 illustrates bitlines and wordlines to be in M6 and M5 layers of the BEOL 120, respectively, in other embodiments, bitlines and wordlines may be provided in any other layers of the BEOL 120. In another example, while FIG. 4 and FIGS. 6-8 illustrate specific numbers of memory cells, in other embodiments, any other number of memory cells may be included in a TFT-eDRAM memory array.

Further, FIGS. 1-8 are intended to show relative arrangements of the elements therein, and that TFT-eDRAM device assemblies of these FIGS. may include other elements that are not specifically illustrated (e.g., various interfacial layers). Similarly, although particular arrangements of materials are discussed with reference to FIGS. 1-8, intermediate materials may be included in the assemblies of these FIGS. Still further, although some elements of the TFT-eDRAM device assemblies are illustrated in FIGS. 1-8 as being planar rectangles or formed of rectangular solids, this is simply for ease of illustration, and embodiments of these assemblies may be curved, rounded, or otherwise irregularly shaped as dictated by, and sometimes inevitable due to, the manufacturing processes used to fabricate semiconductor device assemblies.

Inspection of layout and mask data and reverse engineering of parts of a device to reconstruct the circuit using e.g. optical microscopy, TEM, or SEM, and/or inspection of a cross-section of a device to detect the shape and the location of various device elements described herein using e.g. Physical Failure Analysis (PFA) would allow determination of the TFT-eDRAM memory arrays as described herein.

Exemplary Fabrication Method

Figure 9:
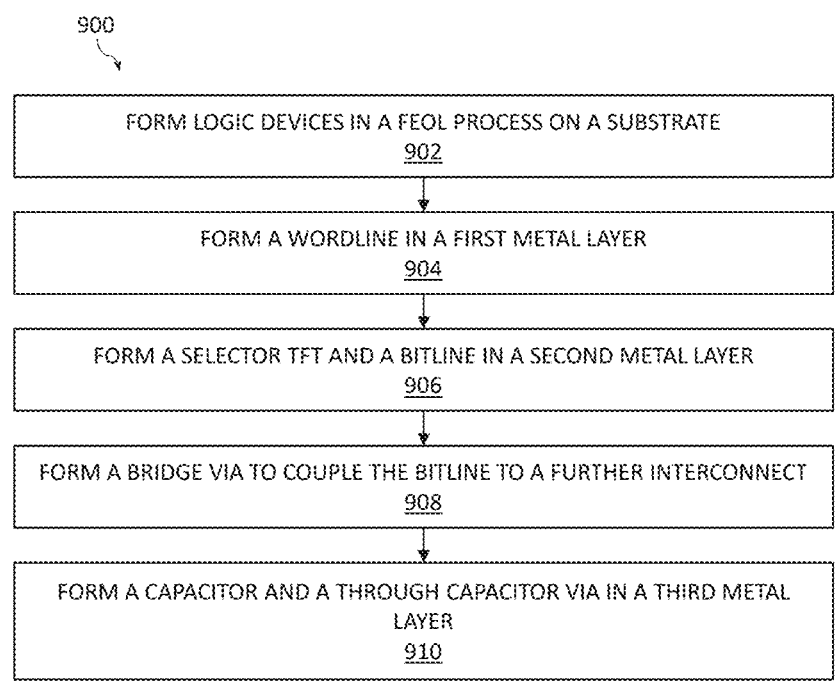
FIG. 9 illustrates an exemplary method of forming an eDRAM memory cell, according to some embodiments of the present disclosure.

FIG. 9 illustrates an exemplary method 900 of forming an eDRAM memory cell, according to some embodiments of the present disclosure. The method 900 may be used to fabricate the TFT-eDRAM memory cells and arrangements as shown in FIGS. 1-8. Although the particular manufacturing operations of the method 900 are discussed below with reference to particular embodiments of the TFT-eDRAM memory cells and arrangements as shown in FIGS. 1-8, at least some of these operations and/or operations with minor modifications may be applied to manufacturing many different embodiments of the TFT-eDRAM memory cells and arrays as discussed herein.

Turning to FIG. 9, the method 900 may begin a process 902 that involves forming logic devices (e.g., transistors, capacitors, resistors, and the like, such as e.g. the FEOL 110) in an FEOL process on a substrate. Subsequently, the logic devices formed in the process 902 may be interconnected in a BEOL process, e.g. in the BEOL 120. Forming TFT-eDRAM memory cells may be part of the BEOL process. Thus, after the process 902, the method 900 may proceed with forming a TFT-eDRAM memory array above at least portions of the logic devices in a BEOL process.

The BEOL processes may include a process 904 that involves forming a wordline in a first metal layer to supply a gate signal. The wordline formed in the process 904 may include any embodiments of the wordline 220 described herein.

The BEOL process may further include a process 906 that involves forming a selector TFT and a bitline in a second metal layer, above the first metal layer, using a thin-film process. The selector TFT may be configured to control a memory state of the memory cell based on the gate signal. Therefore, a gate electrode of the selector TFT may be coupled to the wordline formed in the process 904. The bitline may be coupled to a first S/D electrode of the selector TFT. The selector TFT formed in the process 906 may include any embodiments of the selector TFT 170 described herein. The bitline formed in the process 906 may include any embodiments of the bitline 230 described herein.

The BEOL process may further include a process 908 that involves forming a bridge via to couple the bitline to a further interconnect, namely to a metal interconnect in the second metal layer outside of the eDRAM memory array. The bridge via formed in the process 908 may include any embodiments of the bridge vias 630 described herein. The further interconnect to which the bitline is coupled using a bridge via in the process 908 may include any embodiments of the M6 elements described herein, e.g. as shown in FIG. 6B.

Still further, the BEOL process may include a process 910 that involves forming a capacitor and a through capacitor via in a third metal layer, above the second metal layer. The capacitor may be e.g. a MIM capacitor, coupled to a second S/D electrode of the selector TFT. In some embodiments, the process 910 may include forming a storage node in the second metal layer, the storage node coupled to a second S/D electrode of the selector TFT, and then forming a capacitor coupled to and above the storage node and configured to store memory states of the memory cell. In some embodiments, forming of the capacitor in the process 910 may include forming a bottom electrode coupled to the storage node, forming a dielectric on the bottom electrode, and forming a top electrode on the dielectric and coupled to a MIM capacitor plate, the dielectric insulating the bottom electrode from the top electrode. The through capacitor via formed in the process 910 may extend between the MIM capacitor plate and a landing pad in the second metal layer, and may be coupled to the top electrode of the MIM capacitor. The capacitor formed in the process 910 may include any embodiments of the capacitor 175 described herein. The through capacitor via formed in the process 910 may include any embodiments of the through capacitor via 622 described herein.

Exemplary Electronic Devices

The TFT-eDRAM memory cells/arrays as disclosed herein may be included in any suitable electronic device. FIGS. 10-13 illustrate various examples of apparatuses that may include one or more TFT-eDRAM memory cells or one or more memory arrays including such memory cells, as disclosed herein.

Figures 10A, 10B:
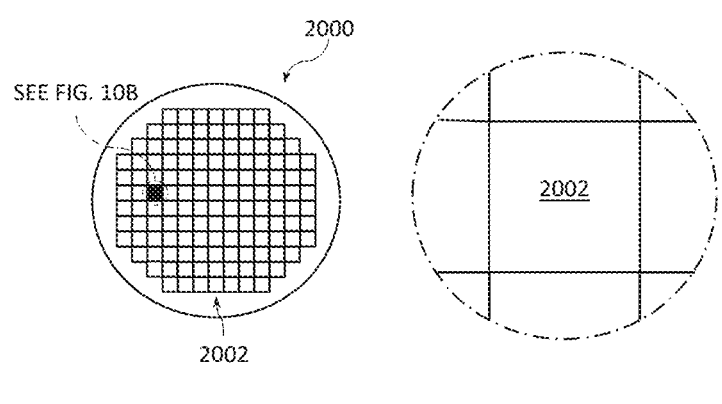
FIGS. 10A-10B are top views of a wafer and dies that include one or more TFT-eDRAM memory cells or one or more memory arrays including such memory cells in accordance with any of the embodiments disclosed herein.

FIGS. 10A-10B are top views of a wafer 2000 and dies 2002 that may include one or more TFT-eDRAM memory cells or one or more memory arrays including such memory cells in accordance with any of the embodiments disclosed herein. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more logic devices formed in the FEOL 110 and one or more TFT-eDRAM memory cells/arrays formed in the BEOL 120 as described herein). After the fabrication of the semiconductor product is complete (e.g., after manufacture of the BEOL 120 with the memory cells as described herein is complete), the wafer 2000 may undergo a singulation process in which each of the dies 2002 is separated from one another to provide discrete "chips" of the semiconductor product. In particular, devices that include one or more TFT-eDRAM memory cells/arrays as disclosed herein may take the form of the wafer 2000 (e.g., not singulated) or the form of the die 2002 (e.g., singulated). The die 2002 may include one or more transistors (e.g., one or more of the transistors 2140 of FIG. 11, discussed below), one or more logic devices (e.g., an AND, OR, NAND, or NOR gate(s)), supporting circuitry to route electrical signals to the transistors and/or logic devices, as well as any other IC components. The die 2002 may further include a memory device that includes any of the TFT-eDRAM memory cells described herein. For example, a memory array formed by multiple memory devices may be formed on a same die 2002 as a processing device (e.g., the processing device 2302 of FIG. 13) or other logic that is configured to store information in the memory devices or execute instructions stored in the memory array.

Figure 11:
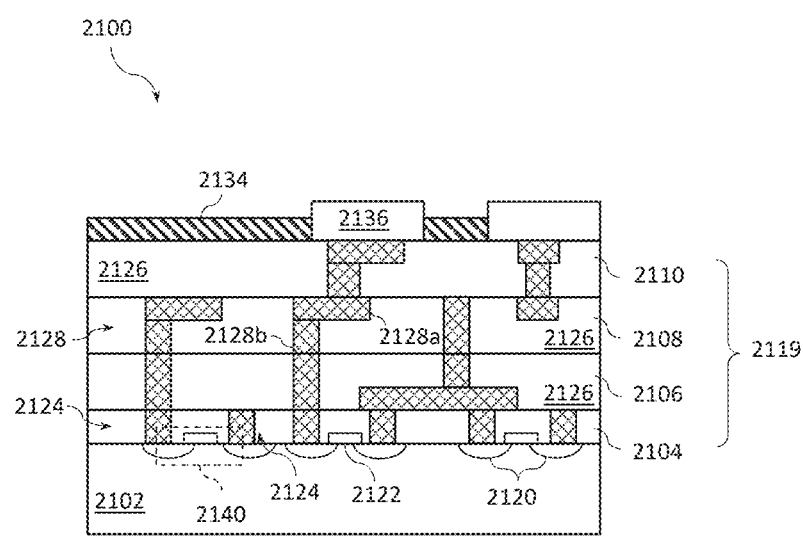
FIG. 11 is a cross-sectional side view of an integrated circuit (IC) device that may include one or more TFT-eDRAM memory cells or one or more memory arrays including such memory cells in accordance with any of the embodiments disclosed herein.

FIG. 11 is a cross-sectional side view of an IC device 2100 that may include one or more TFT-eDRAM memory cells or one or more memory arrays including such memory cells in accordance with any of the embodiments disclosed herein. The IC device 2100 may be formed on a substrate 2102 (e.g., the wafer 2000 of FIG. 10A) and may be included in a die (e.g., the die 2002 of FIG. 10B). The substrate 2102 may be a semiconductor substrate composed of semiconductor material systems including, for example, N-type or P-type materials systems. The substrate 2102 may include, for example, a crystalline substrate formed using a bulk silicon or a silicon-on-insulator substructure. In some embodiments, the semiconductor substrate 2102 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the substrate 2102. Although a few examples of materials from which the substrate 2102 may be formed are described here, any material that may serve as a foundation for an IC device 2100 may be used. The substrate 2102 may be part of a singulated die (e.g., the dies 2002 of FIG. 10B) or a wafer (e.g., the wafer 2000 of FIG. 10A).

The IC device 2100 may include one or more device layers 2104 disposed on the substrate 2102. In various embodiments, the device layer 2104 may include logic devices of the FEOL 110 as described herein. As such, the device layer 2104 may include features of one or more transistors 2140 (e.g., metal oxide semiconductor field-effect transistors (MOSFETs)) formed on the substrate 2102. The device layer 2104 may include, for example, one or more S/D regions 2120, a gate 2122 to control current flow in the transistors 2140 between the S/D regions 2120, and one or more S/D contacts 2124 to route electrical signals to/from the S/D regions 2120. The S/D regions 2120 may be formed either adjacent to or at a distance from the gate 2122 of each transistor 2140, using any suitable processes known in the art. The transistors 2140 may include additional features not depicted for the sake of clarity, such as additional device isolation regions, gate contacts, and the like. The transistors 2140 are not limited to the type and configuration depicted in FIG. 11 and may include a wide variety of other types and configurations such as, for example, planar transistors, non-planar transistors, or a combination of both. Non-planar transistors may include FinFET transistors, such as double-gate transistors or FinFETs, and wrap-around or all-around gate transistors, such as nanoribbon and nanowire transistors. Each transistor 2140 may include a gate 2122 formed of at least two layers, a gate dielectric layer comprising any suitable high-k dielectric material or a stack of high-k dielectric materials, and a gate electrode layer comprising a suitable electrically conductive material, as known in the art.

In some embodiments, when viewed as a cross-section of the transistor 2140 along the source-channel-drain direction, the gate electrode may include a U-shaped structure that includes a bottom portion substantially parallel to the surface of the substrate and two sidewall portions that are substantially perpendicular to the top surface of the substrate (e.g., in a FinFET). In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a FinFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

Electrical signals, such as power and/or input/output (I/O) signals, may be routed to and/or from the transistors 2140 of the device layer 2104 through one or more interconnect layers disposed on the device layer 2104 (illustrated in FIG. 11 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110. The one or more interconnect layers 2106-2110 may form an interlayer dielectric (ILD) stack 2119 of the IC device 2100.

The interconnect structures 2128 may be arranged within the interconnect layers 2106-2110 to route electrical signals according to a wide variety of designs (in particular, the arrangement is not limited to the particular configuration of interconnect structures 2128 depicted in FIG. 11). Although a particular number of interconnect layers 2106-2110 is depicted in FIG. 11, embodiments of the present disclosure include IC devices having more or fewer interconnect layers than depicted. Although not specifically shown in FIG. 11, the interconnect layers 2106-2110 may include various metal layers of the BEOL 120 as described herein, and may implement one or more TFT-eDRAM memory cells or assemblies including such memory cells as described herein.

In some embodiments, the interconnect structures 2128 may include trench structures 2128a (sometimes referred to as "lines") and/or via structures 2128b (sometimes referred to as "holes") filled with an electrically conductive material such as a metal. The trench structures 2128a may be arranged to route electrical signals in a direction of a plane that is substantially parallel with a surface of the substrate 2102 upon which the device layer 2104 is formed. For example, the trench structures 2128a may route electrical signals in a direction in and out of the page from the perspective of FIG. 11. The via structures 2128b may be arranged to route electrical signals in a direction of a plane that is substantially perpendicular to the surface of the substrate 2102 upon which the device layer 2104 is formed. In some embodiments, the via structures 2128b may electrically couple trench structures 2128a of different interconnect layers 2106-2110 together.

The interconnect layers 2106-2110 may include a dielectric material 2126 disposed between the interconnect structures 2128, as shown in FIG. 11. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same.

A first interconnect layer 2106 (referred to as Metal 1 or "M1") may be formed directly on the device layer 2104. In some embodiments, the first interconnect layer 2106 may include trench structures 2128a and/or via structures 2128b, as shown. The trench structures 2128a of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2128b to couple the trench structures 2128a of the second interconnect layer 2108 with the trench structures 2128a of the first interconnect layer 2106. Although the trench structures 2128a and the via structures 2128b are structurally delineated with a line within each interconnect layer (e.g., within the second interconnect layer 2108) for the sake of clarity, the trench structures 2128a and the via structures 2128b may be structurally and/or materially contiguous (e.g., simultaneously filled during a dual-damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

In some embodiments, the IC device 2100 may include a solder resist material 2134 (e.g., polyimide or similar material) and one or more bond pads 2136 formed on the interconnect layers 2106-2110. The bond pads 2136 may be electrically coupled with the interconnect structures 2128 and configured to route the electrical signals of the transistor(s) 2140 to other external devices. For example, solder bonds may be formed on the one or more bond pads 2136 to mechanically and/or electrically couple a chip including the IC device 2100 with another component (e.g., a circuit board). The IC device 2100 may have other alternative configurations to route the electrical signals from the interconnect layers 2106-2110 than depicted in other embodiments. For example, the bond pads 2136 may be replaced by or may further include other analogous features (e.g., posts) that route the electrical signals to external components.

Figure 12:
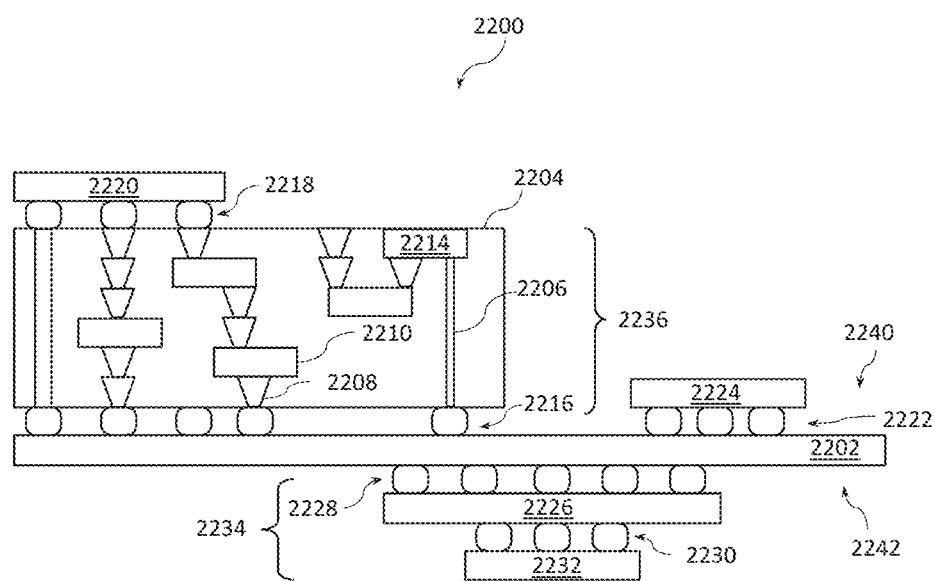
FIG. 12 is a cross-sectional side view of an IC device assembly that may include one or more TFT-eDRAM memory cells or one or more memory arrays including such memory cells in accordance with any of the embodiments disclosed herein.

FIG. 12 is a cross-sectional side view of an IC device assembly 2200 that may include one or more one or more TFT-eDRAM memory cells or one or more memory arrays including such memory cells in accordance with any of the embodiments disclosed herein. The IC device assembly 2200 includes a number of components disposed on a circuit board 2202 (which may be, e.g., a motherboard). The IC device assembly 2200 includes components disposed on a first face 2240 of the circuit board 2202 and an opposing second face 2242 of the circuit board 2202; generally, components may be disposed on one or both faces 2240 and 2242. In particular, any suitable ones of the components of the IC device assembly 2200 may include any of the one or more TFT-eDRAM memory cells or one or more memory arrays including such memory cells in accordance with any of the embodiments disclosed herein.

In some embodiments, the circuit board 2202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2202. In other embodiments, the circuit board 2202 may be a non-PCB substrate.

The IC device assembly 2200 illustrated in FIG. 12 includes a package-on-interposer structure 2236 coupled to the first face 2240 of the circuit board 2202 by coupling components 2216. The coupling components 2216 may electrically and mechanically couple the package-on-interposer structure 2236 to the circuit board 2202, and may include solder balls (as shown in FIG. 12), male and female portions of a socket, an adhesive, an underfill material, and/or any other suitable electrical and/or mechanical coupling structure.

The package-on-interposer structure 2236 may include an IC package 2220 coupled to an interposer 2204 by coupling components 2218. The coupling components 2218 may take any suitable form for the application, such as the forms discussed above with reference to the coupling components 2216. Although a single IC package 2220 is shown in FIG. 12, multiple IC packages may be coupled to the interposer 2204; indeed, additional interposers may be coupled to the interposer 2204. The interposer 2204 may provide an intervening substrate used to bridge the circuit board 2202 and the IC package 2220. The IC package 2220 may be or include, for example, a die (the die 2002 of FIG. 10B), an IC device (e.g., the IC device 2100 of FIG. 11), or any other suitable component. Generally, the interposer 2204 may spread a connection to a wider pitch or reroute a connection to a different connection. For example, the interposer 2204 may couple the IC package 2220 (e.g., a die) to a ball grid array (BGA) of the coupling components 2216 for coupling to the circuit board 2202. In the embodiment illustrated in FIG. 12, the IC package 2220 and the circuit board 2202 are attached to opposing sides of the interposer 2204; in other embodiments, the IC package 2220 and the circuit board 2202 may be attached to a same side of the interposer 2204. In some embodiments, three or more components may be interconnected by way of the interposer 2204.

The interposer 2204 may be formed of an epoxy resin, a fiberglass-reinforced epoxy resin, a ceramic material, or a polymer material such as polyimide. In some implementations, the interposer 2204 may be formed of alternate rigid or flexible materials that may include the same materials described above for use in a semiconductor substrate, such as silicon, germanium, and other group III-V and group IV materials. The interposer 2204 may include metal interconnects 2208 and vias 2210, including but not limited to through-silicon vias (TSVs) 2206. The interposer 2204 may further include embedded devices 2214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 2204. The package-on-interposer structure 2236 may take the form of any of the package-on-interposer structures known in the art.

The IC device assembly 2200 may include an IC package 2224 coupled to the first face 2240 of the circuit board 2202 by coupling components 2222. The coupling components 2222 may take the form of any of the embodiments discussed above with reference to the coupling components 2216, and the IC package 2224 may take the form of any of the embodiments discussed above with reference to the IC package 2220.

The IC device assembly 2200 illustrated in FIG. 12 includes a package-on-package structure 2234 coupled to the second face 2242 of the circuit board 2202 by coupling components 2228. The package-on-package structure 2234 may include an IC package 2226 and an IC package 2232 coupled together by coupling components 2230 such that the IC package 2226 is disposed between the circuit board 2202 and the IC package 2232. The coupling components 2228 and 2230 may take the form of any of the embodiments of the coupling components 2216 discussed above, and the IC packages 2226 and 2232 may take the form of any of the embodiments of the IC package 2220 discussed above. The package-on-package structure 2234 may be configured in accordance with any of the package-on-package structures known in the art.

Figure 13:
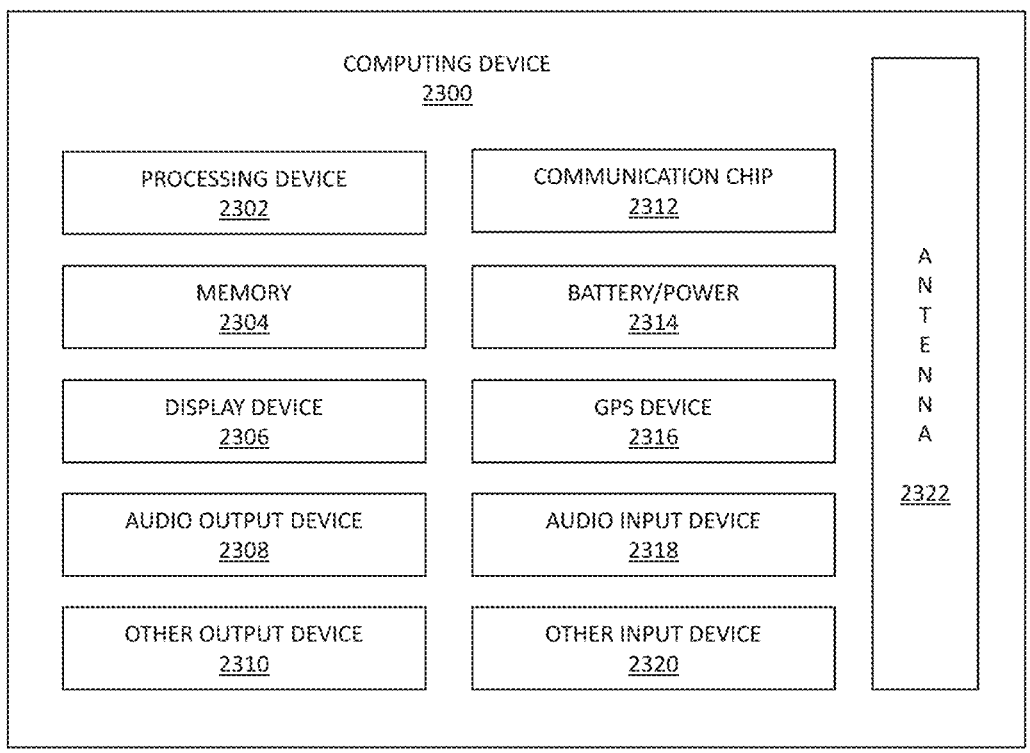
FIG. 13 is a block diagram of an exemplary computing device that may include one or more TFT-eDRAM memory cells or one or more memory arrays including such memory cells in accordance with any of the embodiments disclosed herein.

FIG. 13 is a block diagram of an example computing device 2300 that may include one or more TFT-eDRAM memory cells or one or more memory arrays including such memory cells in accordance with any of the embodiments disclosed herein. For example, any suitable ones of the components of the computing device 2300 may include a die (e.g., the die 2002 shown in FIG. 10B) having one or more TFT-eDRAM memory cells or one or more memory arrays including such memory cells in accordance with any of the embodiments disclosed herein. Any one or more of the components of the computing device 2300 may include, or be included in, an IC device 2100 (FIG. 11). Any one or more of the components of the computing device 2300 may include, or be included in, an IC device assembly 2200 (FIG. 12).

A number of components are illustrated in FIG. 13 as included in the computing device 2300, but any one or more of these components may be omitted or duplicated, as suitable for the application. In some embodiments, some or all of the components included in the computing device 2300 may be attached to one or more motherboards. In some embodiments, some or all of these components are fabricated onto a single SoC die.

Additionally, in various embodiments, the computing device 2300 may not include one or more of the components illustrated in FIG. 13, but the computing device 2300 may include interface circuitry for coupling to the one or more components. For example, the computing device 2300 may not include a display device 2306, but may include display device interface circuitry (e.g., a connector and driver circuitry) to which a display device 2306 may be coupled. In another set of examples, the computing device 2300 may not include an audio input device 2318 or an audio output device 2308, but may include audio input or output device interface circuitry (e.g., connectors and supporting circuitry) to which an audio input device 2318 or audio output device 2308 may be coupled.

The computing device 2300 may include a processing device 2302 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2302 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2300 may include a memory 2304, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, the memory 2304 may include memory that shares a die with the processing device 2302. This memory may be used as cache memory and may include embedded dynamic random access memory (eDRAM) or spin transfer torque magnetic random access memory (STT-MRAM). In some embodiments, the memory 2304 may include one or more TFT-eDRAM memory cells or one or more memory arrays including such memory cells as described herein.

In some embodiments, the computing device 2300 may include a communication chip 2312 (e.g., one or more communication chips). For example, the communication chip 2312 may be configured for managing wireless communications for the transfer of data to and from the computing device 2300. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2312 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2312 may operate in accordance with other wireless protocols in other embodiments. The computing device 2300 may include an antenna 2322 to facilitate wireless communications and/or to receive other wireless communications (such as AM or FM radio transmissions).

In some embodiments, the communication chip 2312 may manage wired communications, such as electrical, optical, or any other suitable communication protocols (e.g., the Ethernet). As noted above, the communication chip 2312 may include multiple communication chips. For instance, a first communication chip 2312 may be dedicated to shorter-range wireless communications such as Wi-Fi or Bluetooth, and a second communication chip 2312 may be dedicated to longer-range wireless communications such as global positioning system (GPS), EDGE, GPRS, CDMA, WiMAX, LTE, EV-DO, or others. In some embodiments, a first communication chip 2312 may be dedicated to wireless communications, and a second communication chip 2312 may be dedicated to wired communications.

The computing device 2300 may include battery/power circuitry 2314. The battery/power circuitry 2314 may include one or more energy storage devices (e.g., batteries or capacitors) and/or circuitry for coupling components of the computing device 2300 to an energy source separate from the computing device 2300 (e.g., AC line power).

The computing device 2300 may include a display device 2306 (or corresponding interface circuitry, as discussed above). The display device 2306 may include any visual indicators, such as a heads-up display, a computer monitor, a projector, a touchscreen display, a liquid crystal display (LCD), a light-emitting diode display, or a flat panel display, for example.

The computing device 2300 may include an audio output device 2308 (or corresponding interface circuitry, as discussed above). The audio output device 2308 may include any device that generates an audible indicator, such as speakers, headsets, or earbuds, for example.

The computing device 2300 may include an audio input device 2318 (or corresponding interface circuitry, as discussed above). The audio input device 2318 may include any device that generates a signal representative of a sound, such as microphones, microphone arrays, or digital instruments (e.g., instruments having a musical instrument digital interface (MIDI) output).

The computing device 2300 may include a GPS device 2316 (or corresponding interface circuitry, as discussed above). The GPS device 2316 may be in communication with a satellite-based system and may receive a location of the computing device 2300, as known in the art.

The computing device 2300 may include an other output device 2310 (or corresponding interface circuitry, as discussed above). Examples of the other output device 2310 may include an audio codec, a video codec, a printer, a wired or wireless transmitter for providing information to other devices, or an additional storage device.

The computing device 2300 may include an other input device 2320 (or corresponding interface circuitry, as discussed above). Examples of the other input device 2320 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2300 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2300 may be any other electronic device that processes data.

SELECT EXAMPLES

The following paragraphs provide various examples of the embodiments disclosed herein.

Example 1 provides an eDRAM memory cell that includes a selector TFT provided over a substrate, a capacitor, a bitline, and a wordline. The selector TFT may be configured to control transfer of a memory state of the memory cell and including a channel layer, a gate electrode, a first S/D electrode, and a second S/D electrode, where the gate electrode is between the substrate and the channel layer, and the channel layer is between the gate electrode and the first and second S/D electrodes (i.e. the selector TFT is a bottom-gated TFT). The capacitor may be configured to store the memory state, coupled to the first S/D electrode. The bitline may be configured to transfer the memory state, and may be coupled to the second S/D electrode. The wordline may be configured to supply a gate signal, and may be coupled to the gate electrode.

Example 2 provides the memory cell according to Example 1, where the wordline is between the substrate and the gate electrode (i.e. the selector TFT is above the wordline).

Example 3 provides the memory cell according to Examples 1 or 2, where the bitline is further away from the substrate than the channel layer (i.e. the bitline is above the channel layer of the selector TFT).

Example 4 provides the memory cell according to any one of the preceding Examples, where a thickness of the bitline (i.e. a dimension measured along the z-axis of the exemplary coordinate system shown in the FIGS.) is between about 5 and 80 nanometers, including all values and ranges therein, e.g. between about 10 and 50 nanometers, or between about 20 and 35 nanometers.

Example 5 provides the memory cell according to any one of the preceding Examples, where the bitline is included in an insulating layer (a layer of a metallization stack) that further includes a metal layer (e.g. M6 layer) for providing electrical connectivity to one or more components other than the memory cell (such as e.g. one or more logic transistors, e.g. FEOL logic transistors), and a thickness of the bitline is at least about 30% smaller, e.g. at least about 50% or at least about 70% smaller, than a thickness of said metal layer.

Example 6 provides the memory cell according to Example 5, where the bitline is electrically connected to said metal layer using a bridge via.

Example 7 provides the memory cell according to any one of the preceding Examples, where the memory cell further includes a storage node, the capacitor is coupled to the first S/D electrode by having a bottom electrode of the capacitor being coupled to the storage node and the storage node being coupled to the first S/D electrode, the capacitor further includes a top electrode coupled to a capacitor plate, and an insulator between the bottom electrode and the top electrode (i.e. an insulator to provide electrical insulation between the bottom electrode and the top electrode).

Example 8 provides the memory cell according to Example 7, where the bitline is included in a first insulating layer (a first layer of a metallization stack) that further includes a first metal layer (e.g. M6 layer), the capacitor is included in a second insulating layer (a second layer of the metallization stack), and the memory cell further includes a capacitor plate metal layer (e.g. M7 layer) for providing electrical connectivity to and coupled to the capacitor plate, the capacitor plate metal layer included in a third insulating layer (a third layer of the metallization stack), where the first insulating layer is between the substrate and the second insulating layer, and the second insulating layer is between the first insulating layer and the third insulating layer.

Example 9 provides the memory cell according to Example 8, further including a through capacitor via coupled to the capacitor plate metal layer (e.g. M7 layer) and to a second metal layer (e.g. an M6 layer for memory array) included in the first insulating layer. Such a metal layer may serve as a stopping layer (landing pad) for the through capacitor via and may be electrically disconnected from other metal layers outside memory array. A through capacitor via may couple capacitor plate metal layer (e.g. M7) and capacitor plate of memory capacitors.

Example 10 provides the memory cell according to Example 9, where the memory cell is a part of a memory array including a plurality of memory cells, and where the through capacitor via is coupled to the first metal layer at a periphery of the memory array.

Example 11 provides the memory cell according to any one of the preceding Examples, where the channel layer of the selector TFT includes one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, indium gallium zinc oxide (IGZO), indium telluride, molybdenite, molybdenum diselenide, tungsten diselenide, tungsten disulfide, and black phosphorus.

Example 12 provides an IC device that includes a substrate; a plurality of wordlines provided over the substrate, in a first BEOL layer of the IC device, a memory array provided over the substrate, the memory array including a plurality of memory cells. Each memory cell may include a selector TFT provided in a second BEOL layer of the IC device, the second BEOL layer being further away from the substrate than the first BEOL layer, and a capacitor provided in a third BEOL layer of the IC device, the third BEOL layer being further away from the substrate than the second BEOL layer, and the capacitor including a first electrode coupled to a first S/D electrode of the selector TFT. The IC device further includes one or more interconnects for providing electrical connectivity for the memory array, the one or more interconnects provided further away from the substrate than the capacitors of the plurality of memory cells; and at least one through capacitor via extending between at least one of the one or more interconnects and a landing pad in the second BEOL layer, and coupled to a second electrode of the capacitor of each of two or more memory cells of the plurality of memory cells.

Example 13 provides the IC device according to Example 12, where the landing pad is outside of the memory array.

Example 14 provides the IC device according to Examples 12 or 13, further including a plurality of bitlines, where each of the plurality of bitlines is coupled to a second S/D electrode of the selector TFTs of a different one of the plurality of memory cells, where a thickness of one or more of the plurality of bitlines is between about 5 and 80 nanometers, including all values and ranges therein, e.g. between about 10 and 50 nanometers, or between about 20 and 35 nanometers.

Example 15 provides the IC device according to Example 14, where each of the plurality of bitlines is coupled to a different one of a plurality of metal interconnects outside of the memory array using a bridge via.

Example 16 provides the IC device according to Example 15, where a thickness of one or more of the plurality of bitlines is at least about 30% smaller, e.g. at least about 50% or at least about 70% smaller, than a thickness of the plurality of metal interconnects outside of the memory array.

Example 17 provides the IC device according to any one of Examples 12-16, where each of the plurality of wordlines is coupled to a gate electrode of the selector TFT of a different one of the plurality of memory cells.

Example 18 provides the IC device according to any one of Examples 12-17, where a channel layer of the selector TFT includes one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, indium gallium zinc oxide (IGZO), indium telluride, molybdenite, molybdenum diselenide, tungsten diselenide, tungsten disulfide, and black phosphorus.

Example 19 provides the IC device according to any one of Examples 12-18, further including a plurality of logic devices provided in a FEOL layer of the IC device, where the first BEOL layer is further away from the substrate than the plurality of logic devices.

Example 20 provides the IC device according to Example 19, where the memory array is above the plurality of logic devices.

Example 21 provides the IC device according to any one of Examples 12-20, where the IC device is coupled to a further IC component.

Example 22 provides the IC device according to Example 21, where the further IC component is one of an interposer, a circuit board, a flexible board, or a package substrate.

In various further Examples, at least some of the memory cells of the IC device according to any one of Examples 12-22 may be implemented as the memory cell according to any one of Examples 1-11.

In various further Examples, the memory cell according to any one of Examples 1-11 or/and the IC device according to any one of Examples 12-22 may be included in a computing device. In one further Example, such a computing device may be a wearable or handheld computing device. In another further Example, such a computing device may further include one or more communication chips and an antenna.

Example 23 provides a method of forming an integrated circuit device with an eDRAM memory array. The method includes forming logic devices in an FEOL process on a substrate and forming the eDRAM memory array above at least portions of the logic devices in a BEOL process. The BEOL process may include forming a wordline in a first metal layer to supply a gate signal, forming a selector TFT in a second metal layer above the first metal layer using a thin-film process, the selector TFT configured to control a memory state of the memory cell based on the gate signal, forming a bitline in the second metal layer, the bitline coupled to a first S/D electrode of the selector TFT, forming a bridge via to couple the bitline to a metal interconnect in the second metal layer outside of the eDRAM memory array, forming a storage node in the second metal layer, the storage node coupled to a second S/D electrode of the selector TFT, and forming a capacitor, e.g. a MIM capacitor coupled to and above the storage node and configured to store the memory state.

Example 24 provides the method according to Example 23, where forming of the MIM capacitor includes forming a bottom electrode coupled to the storage node, forming a dielectric on the bottom electrode, and forming a top electrode on the dielectric and coupled to a MIM capacitor plate, the dielectric insulating the bottom electrode from the top electrode.

Example 25 provides the method according to Example 24, further including forming a through capacitor via extending between the MIM capacitor plate and a landing pad in the second metal layer, and coupled to the top electrode of the MIM capacitor.

In various further Examples, the method of manufacturing the IC device according to any one of Examples 23-25 may further include processes for manufacturing the memory cell according to any one of Examples 1-11 or/and the IC device according to any one of Examples 12-22.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
  a thin-film transistor (TFT) over a substrate, the TFT comprising a channel layer, a gate electrode, a first source/drain (S/D) electrode, and a second S/D electrode, wherein the gate electrode is between the substrate and the channel layer, and the channel layer is between the gate electrode and the first and second S/D electrodes;
  a capacitor coupled to the first S/D electrode;
  a wordline coupled to the gate electrode;
  an insulating layer, the insulating layer including a bitline coupled to the second S/D electrode, and further including an electrically conductive line; and
  a bridge via to electrically couple the bitline and the electrically conductive line, where an electrically conductive material of the bridge via fills a gap between the bitline and the electrically conductive line.

2. The IC device according to claim 1, wherein:
  the wordline is between the substrate and the gate electrode, and
  the bitline is further away from the substrate than the channel layer.

3. The IC device according to claim 1, wherein a thickness of the bitline is between 5 and 80 nanometers.

4. The IC device according to claim 1, wherein a thickness of the bitline is at least 30% smaller than a thickness of the electrically conductive line in the insulating layer.

5. The IC device according to claim 1, wherein:
  the IC device further includes a storage node,
  the capacitor is coupled to the first S/D electrode by having a bottom electrode of the capacitor being coupled to the storage node and the storage node being coupled to the first S/D electrode,
  the capacitor further includes a top electrode coupled to a capacitor plate, and an insulator between the bottom electrode and the top electrode.

6. The IC device according to claim 5, wherein:
  the bitline is included in a first insulating layer that further includes a first metal layer,
  the capacitor is included in a second insulating layer, and
  the IC device further includes a capacitor plate metal layer coupled to the capacitor plate, the capacitor plate metal layer included in a third insulating layer,
  where the first insulating layer is between the substrate and the second insulating layer, and the second insulating layer is between the first insulating layer and the third insulating layer.

7. The IC device according to claim 6, further comprising a through capacitor via coupled to the capacitor plate metal layer and to a second metal layer included in the first insulating layer.

8. The IC device according to claim 7, wherein the IC device includes a memory array comprising a plurality of memory cells, and wherein the through capacitor via is coupled to the first metal layer at a periphery of the memory array.

9. An integrated circuit (IC) device, comprising:
  a substrate;
  a plurality of wordlines over the substrate, in a first back end of line (BEOL) layer of the IC device;
  a memory array comprising a plurality of memory cells, each memory cell comprising:
    a thin-film transistor (TFT) in a second BEOL layer of the IC device, the second BEOL layer being further away from the substrate than the first BEOL layer, and
    a capacitor in a third BEOL layer of the IC device, the third BEOL layer being further away from the substrate than the second BEOL layer, and the capacitor comprising a first electrode coupled to a first source or drain (S/D) electrode of the TFT;
  one or more interconnects for providing electrical connectivity for the memory array, the one or more interconnects provided further away from the substrate than the capacitors of the plurality of memory cells;
  at least one through capacitor via extending between at least one of the one or more interconnects and a landing pad in the second BEOL layer, and coupled to a second electrode of the capacitor of each of two or more memory cells of the plurality of memory cells; and
  a plurality of bitlines, where each of the plurality of bitlines is coupled to a second S/D electrode of the TFTs of a different one of the plurality of memory cells, and where each of the plurality of bitlines is coupled to a different one of a plurality of metal interconnects outside of the memory array using a bridge via.

10. The IC device according to claim 9, wherein the landing pad is outside of the memory array.

11. The IC device according to claim 9,
  wherein a thickness of one or more of the plurality of bitlines is between 20 and 35 nanometers.

12. The IC device according to claim 9, wherein a thickness of one or more of the plurality of bitlines is at least 50% smaller than a thickness of the plurality of metal interconnects outside of the memory array.

13. The IC device according to claim 9, wherein each of the plurality of wordlines is coupled to a gate electrode of the TFT of a different one of the plurality of memory cells.

14. The IC device according to claim 9, further comprising:
  a plurality of logic devices in a front end of line (FEOL) layer of the IC device, where the first BEOL layer is further away from the substrate than the plurality of logic devices.

15. The IC device according to claim 14, wherein the memory array is above the plurality of logic devices.

16. The IC device according to claim 9, where the IC device is coupled to a further IC component.

17. The IC device according to claim 16, wherein the further IC component is one of an interposer, a circuit board, a flexible board, or a package substrate.

18. The IC device according to claim 1, wherein:
  the IC device includes a memory array,
  the memory array includes a plurality of memory cells,
  an individual one of the plurality of memory cells includes the TFT and the capacitor, and
  the bridge via and the electrically conductive line are at a periphery of the memory array.

19. The IC device according to claim 1, wherein the IC device is a dynamic random-access memory (DRAM) device.

20. The IC device according to claim 1, wherein the IC device is a computing device that includes an embedded dynamic random-access memory (eDRAM) device, and wherein the eDRAM device includes the TFT, the capacitor, the wordline, the bitline, the insulating layer, and the bridge via.

21. The IC device according to claim 9, wherein the IC device is a dynamic random-access memory (DRAM) device.

22. The IC device according to claim 9, wherein the IC device is a computing device that includes an embedded dynamic random-access memory (eDRAM) device, and wherein the eDRAM device includes the substrate, the plurality of wordlines, the memory array, the one or more interconnects, the at least one through capacitor via, and the plurality of bitlines.

23. An integrated circuit (IC) device, comprising:
- a front-end of line (FEOL) portion, comprising a plurality of logic devices; and
- a back-end of line (BEOL) portion, comprising a capacitor plate and a memory array that includes:
  - a plurality of memory cells, where an individual memory cell of the plurality of memory cells includes a thin-film transistor (TFT), a storage node, and a capacitor having a first capacitor electrode and a second capacitor electrode, where the first capacitor electrode is coupled to the storage node, the storage node is coupled to a first source/drain (S/D) region of the TFT, and where the second capacitor electrode is coupled to the capacitor plate,
  - a wordline, coupled to a gate of the TFT, and
  - a bitline, coupled a second S/D region of the TFT, wherein:
- the BEOL portion includes a first insulating layer, a second insulating layer, and a third insulating layer,
- the first insulating layer is between the FEOL portion and the second insulating layer,
- the second insulating layer is between the first insulating layer and the third insulating layer,
- the storage node and the bitline are in the first insulating layer,
- the capacitor is in the second insulating layer,
- the capacitor plate is in the third insulating layer,
- the BEOL portion further includes a conductive via that extends through the third layer and the second layer and lands on a landing pad in the first layer,
- the capacitor plate is coupled to the conductive via, and
- the conductive via and the landing pad are outside of a footprint of the memory array.

24. The IC device according to claim 23, wherein:
- the BEOL portion further includes a fourth insulating layer,
- the third insulating layer is between the second insulating layer and the fourth insulating layer,
- the conductive via has a first end coupled to a common capacitor plate in the fourth insulating layer, and a second end coupled to the landing pad in the first layer.

25. The IC device according to claim 23, further comprising:
- a bridge via outside of the footprint of the memory array, and
- an electrically conductive line outside of the footprint of the memory array,
- where the bridge via has a first end coupled to the bitline and a second end coupled to the electrically conductive line.

* * * * *